US012751153B2

(12) United States Patent
Heo et al.

(10) Patent No.: US 12,751,153 B2
(45) Date of Patent: Sep. 29, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Seongkweon Heo, Yongin-si (KR); Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

(21) Appl. No.: 18/395,429

(22) Filed: Dec. 22, 2023

(65) Prior Publication Data

US 2024/0130170 A1 Apr. 18, 2024

Related U.S. Application Data

(62) Division of application No. 17/135,823, filed on Dec. 28, 2020, now Pat. No. 11,856,820.

(30) Foreign Application Priority Data

Jan. 2, 2020 (KR) ........................ 10-2020-0000491

(51) Int. Cl.
*H10K 59/123* (2023.01)
*H10K 59/12* (2023.01)
*H10K 59/80* (2023.01)

(52) U.S. Cl.
CPC ....... *H10K 59/123* (2023.02); *H10K 59/1201* (2023.02); *H10K 59/805* (2023.02)

(58) Field of Classification Search
CPC ... H10K 59/123; H10K 59/00; H10K 59/1201
USPC ........................................................... 257/40
See application file for complete search history.

(56) References Cited

U.S. PATENT DOCUMENTS 10,121,553 B2 11/2018 Harari
10,193,102 B2 1/2019 Kanaya
10,276,640 B2 4/2019 Chung et al.
10,553,819 B2 2/2020 Kim et al.
2002/0027298 A1 3/2002 Sakamoto et al.
2005/0051776 A1 3/2005 Miyagi et al.
2005/0110011 A1 5/2005 Im et al.
(Continued)

FOREIGN PATENT DOCUMENTS

CN 107403826 A 11/2017
JP 2018-087863 A 6/2018
(Continued)

*Primary Examiner* — Dzung Tran
(74) *Attorney, Agent, or Firm* — Womble Bond Dickinson (US) LLP

(57) ABSTRACT

A display apparatus includes: a semiconductor layer on a substrate; a gate insulating layer on the substrate and covering the semiconductor layer; a gate electrode on the gate insulating layer and at least partially overlapping the semiconductor layer; an interlayer insulating layer on the gate electrode; and an electrode layer on the interlayer insulating layer and electrically connected to the semiconductor layer, wherein the interlayer insulating layer comprises a first portion and a second portion extending from the first portion, and the electrode layer is on the first portion of the interlayer insulating layer, and a step is provided by a difference in thicknesses of the first portion and the second portion.

8 Claims, 17 Drawing Sheets

(56) References Cited

U.S. PATENT DOCUMENTS

| | | | | |
|---|---|---|---|---|
| 2009/0045403 | A1* | 2/2009 | Yamazaki | H10D 86/441<br>257/E33.001 |
| 2010/0308326 | A1 | 12/2010 | Kim et al. | |
| 2013/0037812 | A1 | 2/2013 | Park et al. | |
| 2014/0097455 | A1 | 4/2014 | Ono | |
| 2015/0108454 | A1 | 4/2015 | Kim | |
| 2016/0035805 | A1* | 2/2016 | Kim | H10K 59/80515<br>345/76 |
| 2016/0093647 | A1 | 3/2016 | Kim et al. | |
| 2017/0125500 | A1 | 5/2017 | Kim | |
| 2017/0148884 | A1* | 5/2017 | Li | H01L 29/41733 |
| 2017/0287992 | A1 | 10/2017 | Kwak et al. | |
| 2017/0338245 | A1 | 11/2017 | Park et al. | |
| 2018/0151834 | A1 | 5/2018 | Kanaya | |
| 2019/0326378 | A1 | 10/2019 | Kim et al. | |
| 2019/0355799 | A1 | 11/2019 | Jeong et al. | |
| 2020/0235194 | A1 | 7/2020 | Ito et al. | |

FOREIGN PATENT DOCUMENTS

| | | | |
|---|---|---|---|
| JP | 2019-075229 | A | 5/2019 |
| KR | 10-2005-0050495 | A | 5/2005 |
| KR | 10-2017-0029041 | A | 3/2017 |
| KR | 10-2017-0111827 | A | 10/2017 |
| KR | 10-2019-0094269 | A | 8/2019 |
| KR | 10-2019-0122923 | A | 10/2019 |

* cited by examiner

DISPLAY APPARATUS AND METHOD OF MANUFACTURING THE SAME

CROSS-REFERENCE TO RELATED APPLICATIONS

This application is a divisional of U.S. patent application Ser. No. 17/135,823, filed Dec. 28, 2020, which claims priority to and the benefit of Korean Patent Application No. 10-2020-0000491, filed Jan. 2, 2020, the entire content of both of which is incorporated herein by reference.

BACKGROUND

1. Field

Aspects of one or more embodiments relate to a display apparatus and a method of manufacturing the same.

2. Description of Related Art

Display apparatuses are apparatuses that display data visually. Display apparatuses may be utilized as display units in a variety of applications, for example, for small products such as mobile phones or display units for large products such as televisions (TVs).

Display apparatuses may include a substrate divided into a display area and a non-display area, and gate lines and data lines are formed in the display area and are insulated from each other. The gate lines and the data lines cross each other so that a plurality of pixel areas are defined in the display area, and the plurality of pixel areas emit light by receiving electrical signals so as to display images to the outside. A thin-film transistor corresponding each of the pixel areas and a pixel electrode electrically connected to the thin-film transistor may be utilized, and an opposite electrode may be utilized in common to the pixel areas. Various wirings for transmitting electrical signals to the display area, a gate driving unit, a data driving unit, and a controller may be provided in the non-display area.

As technology progresses, the various applications and uses of display apparatuses is diversifying. Also, the thickness of a display apparatus is generally becoming thinner and the weight thereof is becoming lighter, so that the range of uses thereof has become more widespread. Thus, research into the production of display apparatuses is briskly under way, and various attempts have been made to reduce additional equipment and increase yield.

The above information disclosed in this Background section is only for enhancement of understanding of the background and therefore the information discussed in this Background section does not necessarily constitute prior art.

SUMMARY

Aspects of one or more embodiments relate to a display apparatus and a method of manufacturing the same, and for example, to a display apparatus with secured transmittance and a method of manufacturing the same.

Aspects of one or more embodiments include a display apparatus with relatively high quality transmittance and a method of manufacturing the same.

However, this characteristic is just an example, and the scope of embodiments according to the present disclosure is not limited thereby.

Additional aspects will be set forth in part in the description which follows and, in part, will be apparent from the description, or may be learned by practice of the presented example embodiments of the disclosure.

According to one or more example embodiments, a display apparatus includes a semiconductor layer arranged on a substrate, a gate insulating layer arranged on the substrate and covering the semiconductor layer, a gate electrode arranged on the gate insulating layer so that part of the gate electrode overlaps the semiconductor layer, an interlayer insulating layer arranged on the gate electrode, and an electrode layer arranged on the interlayer insulating layer and electrically connected to the semiconductor layer, wherein the interlayer insulating layer includes a first portion and a second portion extending from the first portion, and the electrode layer is arranged on the first portion of the interlayer insulating layer, and a step is provided by a difference in thicknesses of the first portion and the second portion.

According to some example embodiments, the thickness of the first portion may be greater than the thickness of the second portion.

According to some example embodiments, a width of a top surface of the first portion may be greater than a width of a bottom surface of the electrode layer.

According to some example embodiments, the width of the top surface of the first portion may be the same as the width of the bottom surface of the electrode layer.

According to some example embodiments, the interlayer insulating layer may have a single layer structure and may include silicon oxide.

According to some example embodiments, the interlayer insulating layer may include a first interlayer insulating layer and a second interlayer insulating layer, and the first interlayer insulating layer and the second interlayer insulating layer may be sequentially arranged on the gate electrode.

According to some example embodiments, the first interlayer insulating layer may include silicon oxide, and the second interlayer insulating layer may include silicon nitride.

According to some example embodiments, the thickness of the first portion of the second interlayer insulating layer may be greater than the thickness of the second portion of the second interlayer insulating layer.

According to some example embodiments, a top surface of the first interlayer insulating layer corresponding to the second portion of the second interlayer insulating layer may be exposed.

According to some example embodiments, the substrate may include a first area, a second area surrounding the first area, and a third area between the first area and the second area, and the interlayer insulating layer may have a first opening corresponding to the first area, and the gate insulating layer may have a second opening corresponding to the first area.

According to some example embodiments, the display apparatus may further include a buffer layer arranged between the substrate and the semiconductor layer, and the buffer layer may have a third opening corresponding to the first area.

According to some example embodiments, the display apparatus may further include a component arranged under the substrate in correspondence with the first area.

According to one or more example embodiments, a method of manufacturing a display apparatus, includes forming a semiconductor layer on a substrate, forming a gate insulating layer so as to cover the semiconductor layer, forming a gate electrode on the gate insulating layer, at least part of the gate electrode overlapping the semiconductor layer, forming an interlayer insulating layer on the gate electrode, forming a contact hole, the contact hole passing through the gate insulating layer and the interlayer insulating layer and exposing part of the semiconductor layer, forming an electrode layer on a first portion of the interlayer insulating layer, the electrode layer electrically connected to the semiconductor layer through the contact hole, a photoresist pattern on the electrode layer, etching the electrode layer by using the photoresist pattern as a mask, and etching part of a second portion of the interlayer insulating layer, the second portion extending from the first portion of the interlayer insulating layer.

According to some example embodiments, the first substrate may include a first area, a second area surrounding the first area, and a third area between the first area and the second area, and the gate insulating layer and the interlayer insulating layer located on the first area may be removed together when the contact hole is formed.

According to some example embodiments, the method may further include forming a buffer layer between the substrate and the semiconductor layer, and the buffer layer located on the first area may be etched together when part of the interlayer insulating layer is etched.

According to some example embodiments, the method may further include cleaning the electrode layer, and cleaning of the electrode layer and etching part of the interlayer insulating layer may be simultaneously (or concurrently) performed.

According to some example embodiments, when part of the interlayer insulating layer is etched, carbon tetrafluoride ($CF_4$) may be used.

According to some example embodiments, when part of the interlayer insulating layer is etched, a bias voltage may be applied.

According to some example embodiments, the method may further include removing the photoresist pattern.

According to some example embodiments, a width of a top surface of the first portion may be greater than a width of a bottom surface of the electrode layer.

Other aspects, features, and characteristics than those described above will become more apparent from detailed contents, claims, and drawings for implementing embodiments according to the following disclosure.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
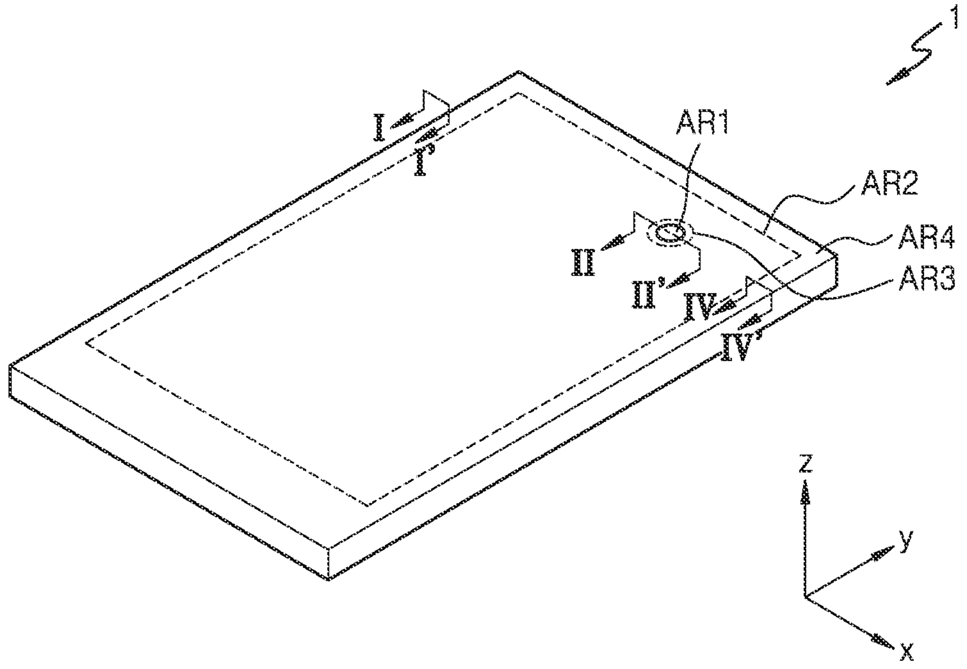
FIG. 1 is a perspective view schematically illustrating a display apparatus according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the invention allows for various changes and numerous embodiments, particular embodiments will be illustrated in the drawings and described in more detail in the written description. The effects and features of the present disclosure, and a way to achieve them will be apparent by referring to embodiments that will be described in more detail together with the drawings. However, the scope of embodiments according to present disclosure is not limited by the following example embodiments but may be embodied in various forms.

Hereinafter, aspects of some example embodiments of the present disclosure will be described below in more detail with reference to the accompanying drawings. Those elements that are the same or are in correspondence are rendered the same reference numeral regardless of the figure number, and a redundant description therewith is omitted.

It will be understood that although the terms "first," "second," etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on," another layer, region, or element, it may be directly or indirectly formed on the other layer, region, or element. That is, for example, intervening layers, regions, or elements may be present.

Sizes of elements in the drawings may be exaggerated or reduced for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" represents A, B, or A and B. "At least one of A and B" represents A, B, or A and B.

It will be understood that when a layer, region, or element is referred to as being "connected to," another layer, region, or element, it may be directly or indirectly connected to the other layer, region, or element. That is, for example, intervening layers, regions, or elements may be present. For example, it will be understood that when a layer, region, or element is referred to as being "electrically connected to," another layer, region, or element, it may be directly or indirectly connected to the other layer, region, or element. That is, for example, intervening layers, regions, or elements may be present.

The x-axis, the y-axis and the z-axis are not limited to three axes of the rectangular coordinate system, and may be interpreted in a broad sense. For example, the x-axis, the y-axis, and the z-axis may be perpendicular to one another, or may represent different directions that are not perpendicular to one another.

Hereinafter, example embodiments of the present disclosure will be described in more detail with reference to the accompanying drawings.

FIG. 1 is a perspective view schematically illustrating a display apparatus 1 according to some example embodiments.

Referring to FIG. 1, the display apparatus 1 may include a first area AR1, a second area AR2, a third area AR3, and a fourth area AR4.

According to some example embodiments, the third area AR3 and the fourth area AR4 may be arranged to be adjacent to the second area AR2, and the display apparatus 1 may provide or display certain images by using light emitted from a plurality of pixels arranged in the second area AR2. The second area AR2 may be a display area in which light is emitted, and the third area AR3 and the fourth area AR4 may be a non-display area in which no light is emitted.

The display apparatus 1 may include the first area AR1 at least partially surrounded by the second area AR2. According to some example embodiments, FIG. 1 illustrates that the first area AR1 is entirely surrounded by the second area AR2. The third area AR3 may entirely surround the first area AR1, the second area AR2 may entirely surround the third area AR3, and the fourth area AR4 may entirely surround the second area AR2.

According to some example embodiments, the first area AR1 may be a position where an electronic element is arranged, as will be described in more detail later with reference to FIG. 2A. That is, the first area AR1 will be understood as a transmission area through which light or/and sound that is output from the electronic element to the outside or proceeding toward the electronic element from the outside may transmit or pass.

Hereinafter, an organic light-emitting display apparatus is described as an example of the display apparatus 1 according to some example embodiments. However, the display apparatus according to the present disclosure is not limited thereto. According to some example embodiments, various types of display apparatuses, such as an inorganic electroluminescence (EL) display apparatus and a quantum dot light-emitting display apparatus, may be used.

Figure 2A:
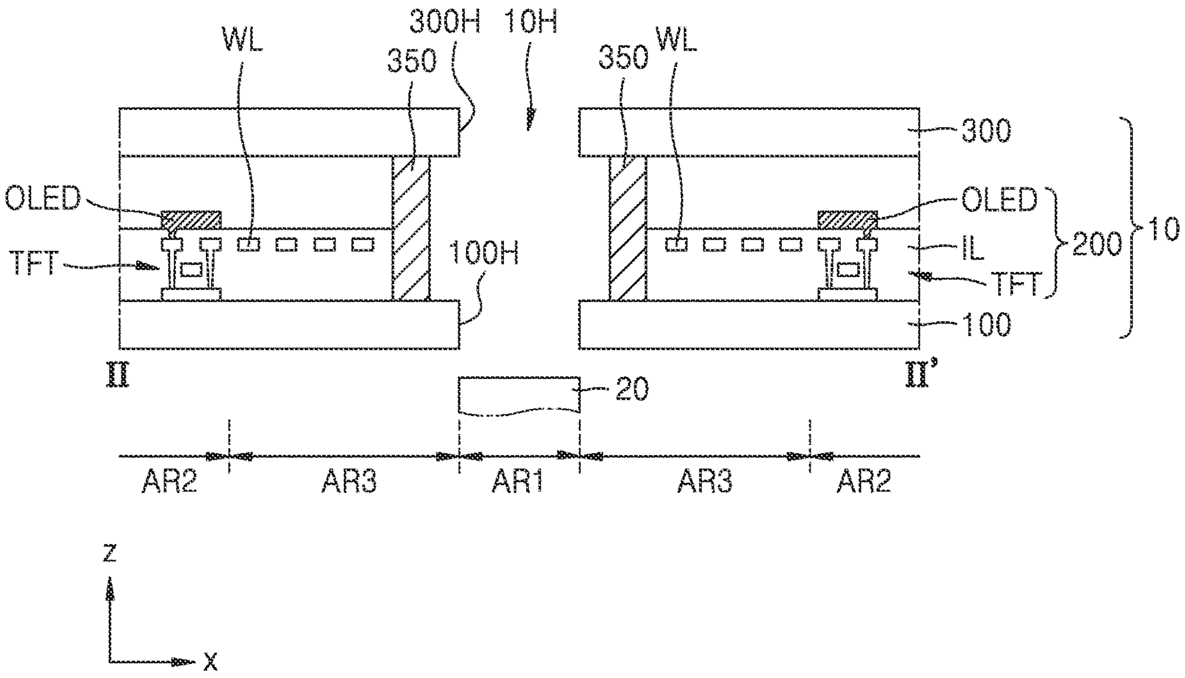
FIG. 2A is a cross-sectional view schematically illustrating the display apparatus cut along the line II-II' of FIG. 1.
Figure 2B:
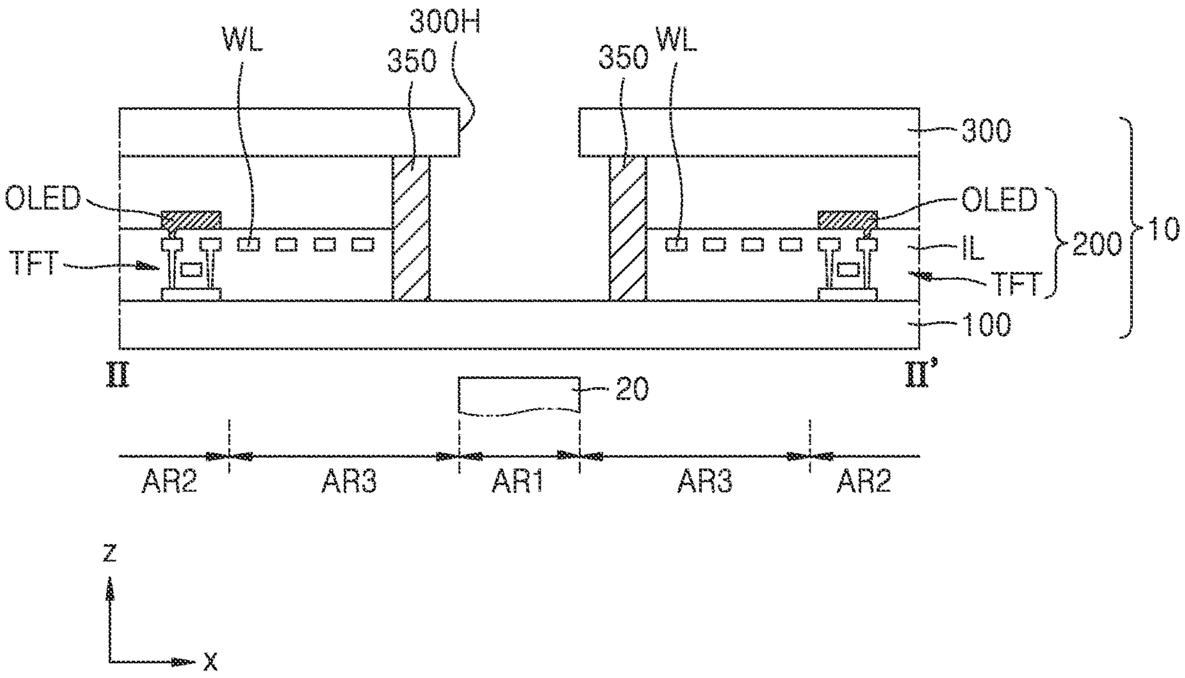
FIG. 2B is a cross-sectional view schematically illustrating the display apparatus cut along the line II-II' of FIG. 1.
Figure 2C:
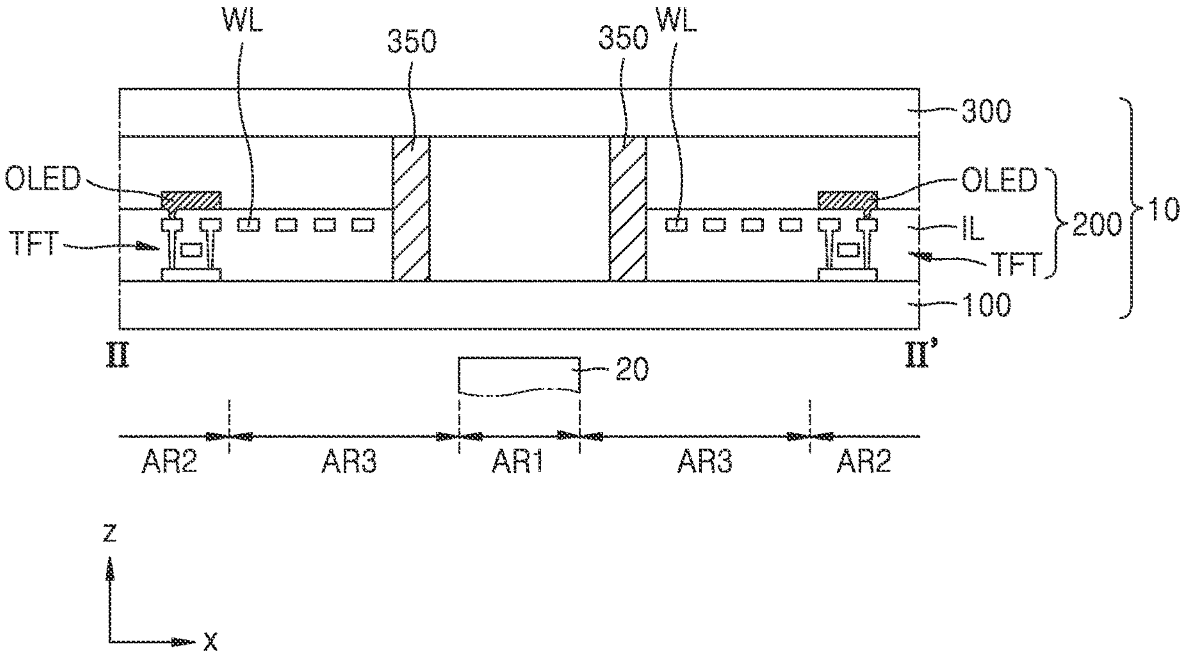
FIG. 2C is a cross-sectional view schematically illustrating the display apparatus cut along the line II-II' of FIG. 1.
Figure 2D:
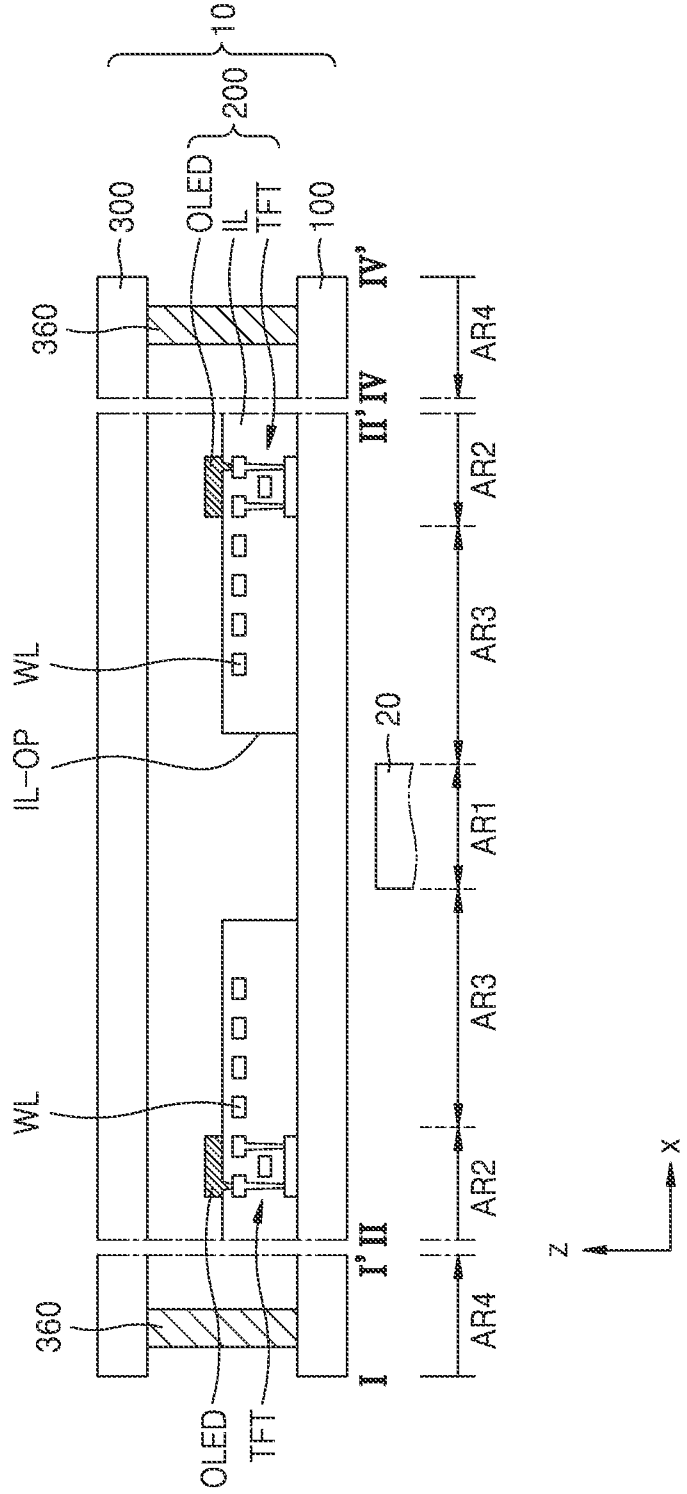
FIG. 2D is a cross-sectional view schematically illustrating the display apparatus cut along the lines I-I', II-II', and IV-IV' of FIG. 1.

FIGS. 2A through 2C are cross-sectional views schematically illustrating the display apparatus cut along the line II-II' of FIG. 1, and FIG. 2D is a cross-sectional view schematically illustrating the display apparatus cut along the lines I-I', II-II', and IV-IV' of FIG. 1.

Referring to FIG. 2A, the display apparatus (see 1 of FIG. 1) may include a display panel 10 including a display element, and a component 20 corresponding to the first area AR1.

The display panel 10 may include a substrate 100, an encapsulation substrate 300 that is an encapsulation member facing the substrate 100, and a display element layer 200 therebetween. A sealing member (sealant) 350 may be arranged between the substrate 100 and the encapsulation substrate 300 to cover a side surface of the display element layer 200. FIG. 2A illustrates that the sealing member 350 are arranged at both sides of the first area AR1. However, when viewed from a direction perpendicular to a main surface (e.g., a direction normal with respect to a display surface or plane of the display panel 10) of the substrate 100, it will be understood that the first area AR1 is entirely surrounded by the sealing member 350.

The substrate 100 may include a glass material, a ceramic material, a metal material, or a flexible or bendable material. The substrate 100 may have a single layer or multi-layer structure of the above-described material, and in the case where the substrate 100 has a multi-layer structure, the substrate 100 may further include an inorganic layer. In some example embodiments, the substrate 100 may have a structure of an organic material/inorganic material/organic material.

The encapsulation substrate 300 may be arranged to face the substrate 100 and may include glass or polymer resin described above.

The display element layer 200 may include a circuit layer including a thin-film transistor (TFT), an organic light-emitting diode (OLED) that is a display element connected to the thin-film transistor TFT, and an insulating layer IL therebetween. The thin-film transistor (TFT) and the organic light-emitting diode (OLED) connected thereto may be arranged in the second area AR2, and some wirings WL of the display element layer 200 may be located in the third area AR3. The second area AR2 may be a display area in which light is emitted, and the third area AR3 may be a non-display area in which no light is emitted.

The wirings WL may provide a certain signal or voltage to pixels that are apart from each other with the first area AR1 therebetween. In FIG. 2A, the wirings WL do not overlap the sealing member 350 in the third area AR3. However, according to some example embodiments, part of the sealing member 350 may be arranged on the wirings WL.

The display panel 10 may include a through hole 10H corresponding to the first area AR1. For example, the substrate 100 and the encapsulation substrate 300 may respectively include through holes 100H and 300H each corresponding to the first area AR1. The display element layer 200 may also include a through hole corresponding to the first area AR1.

According to some example embodiments, elements, such as an input sensing member for sensing touch input, an antireflective member including a polarizer and a retarder or a color filter and a black matrix, and a transparent window may be further arranged on the display panel 10.

A component 20 may be located in the first area AR1. The component 20 may be an electronic element using light or sound. For example, the electronic element may include a sensor for receiving and using light, such as an infrared sensor, a camera that receives light so as to capture an image, a sensor that outputs and senses light or sound so as to measure a distance or to recognize a fingerprint, a small lamp that outputs light, or a speaker that outputs sound. An electronic element that uses light may use light having various wavelength bands, such as visible rays, infrared rays, ultraviolet (UV) rays. When the display panel 10 includes the through hole 10H corresponding to the first area AR1, like in FIG. 2A, light or sound that is output or received by the electronic element may be more effectively utilized.

Unlike FIG. 2A in which the display panel 10 includes the through hole 10H corresponding to the first area AR1, some elements of the display panel 10 may not include a through hole. For example, as shown in FIG. 2B, the encapsulation substrate 300 includes a through hole 300H corresponding to the first area AR1 but the substrate 100 may not include a through hole.

Alternatively, as shown in FIGS. 2C and 2D, both the substrate 100 and the encapsulation substrate 300 may not include a through hole corresponding to the first area AR1. In FIG. 2C, the sealing member 350 may be arranged on the third area AR3 to surround the first area AR1.

Also, in FIG. 2D, the sealing member 350 may not be provided around the first area AR1, unlike FIG. 2C. The sealing member 360 may be located on the fourth area AR4, and by bonding the substrate 100 to the encapsulation substrate 300, the display element layer 200 may be sealed from outside air. According to some example embodiments, the display apparatus 1 of FIGS. 2A through 2C may include the sealing member 360 to surround the outside of the second area AR2.

The insulating layer IL of FIG. 2D may have an opening IL-OP corresponding to the first area AR1. According to some example embodiments, no components may be arranged between the substrate 100 and the encapsulation substrate 300 in correspondence with the first area AR1. According to some example embodiments, some inorganic insulating layers, such as a buffer layer, may remain in the first area AR1 of the substrate 100.

As shown in FIGS. 2B through 2D, even though the substrate 100 does not include the through hole 100H, portions of the display element layer 200 corresponding to the first area AR1 may be removed to secure light transmittance for the electronic element. When the display apparatus 1 includes the display panel 10 shown in FIGS. 2B through 2D, it may be appropriate to use an electronic element using light as the electronic element.

As illustrated in FIGS. 2A through 2D, the component 20 is located under the display panel 10, i.e., at one side of the substrate 100. However, at least part of the component 20 may be inserted into the through hole 10H so as to overlap the side surface of the display panel 10 for defining the through hole 10H.

The component 20 may be a member other than the electronic element described above. According to some example embodiments, when the display panel 10 is used as a smart watch or an instrument panel for a vehicle, the component 20 may be a member including a clock hand or a needle indicating certain information (e.g., vehicle speed, etc.). Alternatively, the component 20 may include an element such as an accessory for increasing an esthetic sense of the display panel 10.

Figure 3:
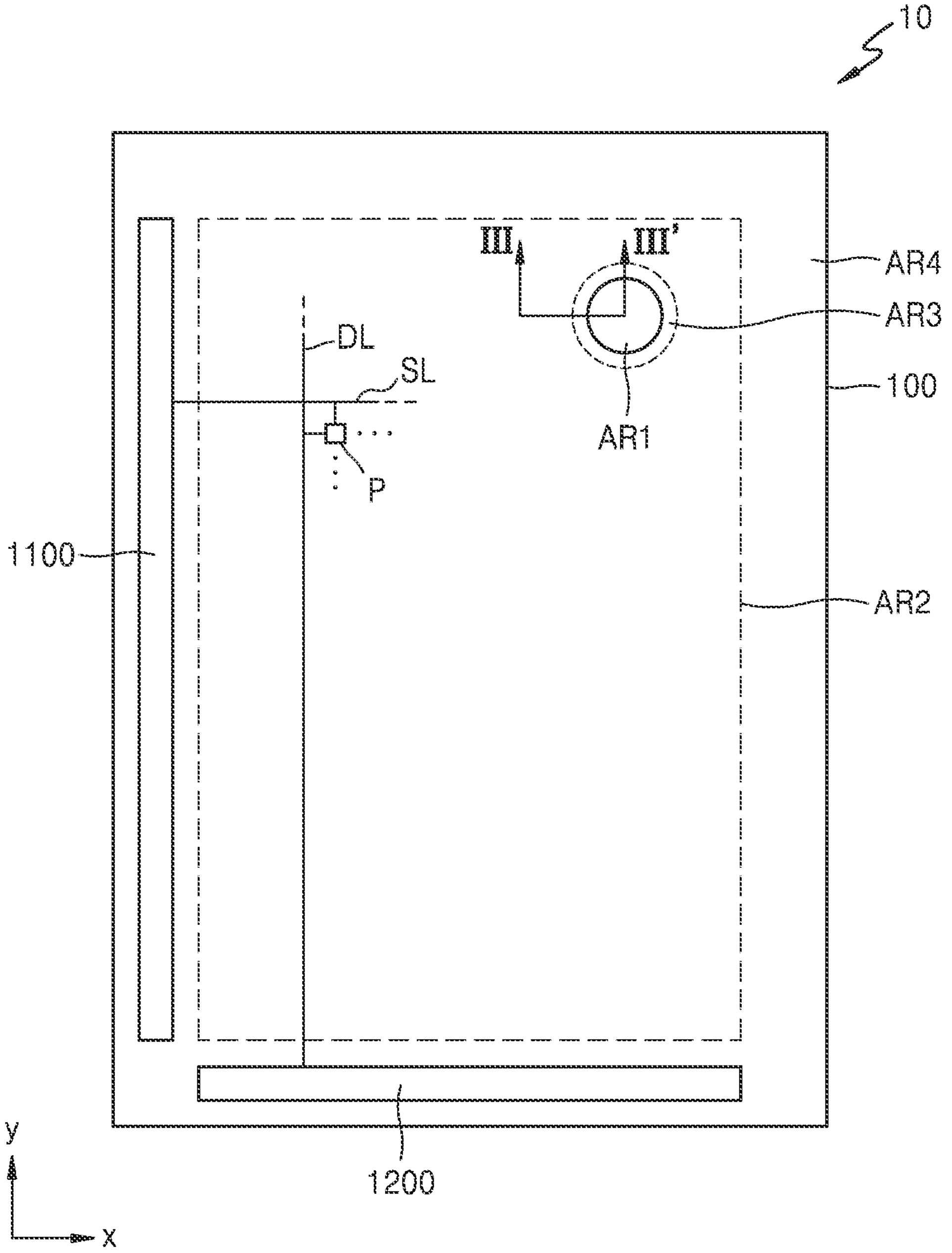
FIG. 3 is a plan view schematically illustrating a display panel according to some example embodiments.
Figure 4:
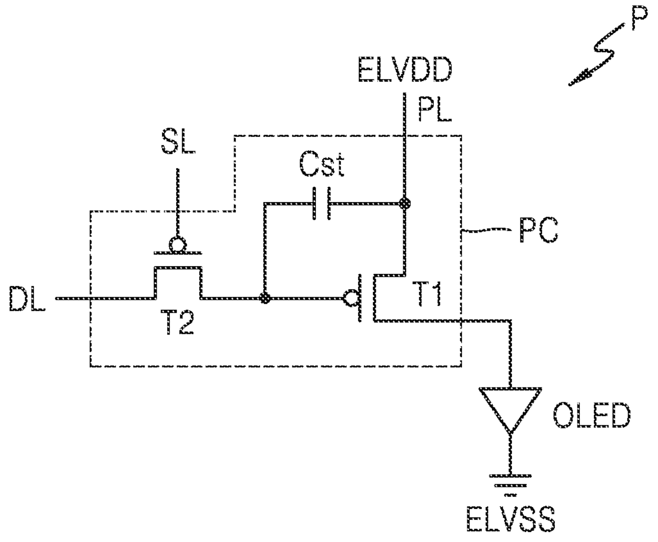
FIG. 4 is an equivalent circuit diagram of one pixel of a display apparatus according to some example embodiments.

FIG. 3 is a plan view schematically illustrating a display panel according to some example embodiments, and FIG. 4 is an equivalent circuit diagram of one pixel of a display apparatus according to an embodiment.

Referring to FIG. 3, the display panel 10 may include a first area AR1, a second area AR2, a third area AR3, and a fourth area AR4. FIG. 3 will be understood as the appearance of the substrate 100 of the display panel 10. For example, the substrate 100 will be understood to have the first area AR1, the second area AR2, the third area AR3, and the fourth area AR4.

The display panel 10 may include a plurality of pixels P arranged in the second area AR2. Each pixel P may include a pixel circuit PC and an organic light-emitting diode (OLED) that is a display element connected to the pixel circuit PC, as shown in FIG. 4. The pixel circuit PC may include a driving thin-film transistor (TFT) T1, a switching thin-film transistor (TFT) T2, and a storage capacitor Cst. Each pixel P may emit red, green, blue, or white light, for example, through the organic light-emitting diode (OLED).

The switching thin-film transistor (TFT) T2 may be connected to a scan line SL and a data line DL and may transmit a data voltage input from the data line DL to the driving thin-film transistor (TFT) T1 according to a switching voltage input from the scan line SL. The storage capacitor Cst may be connected to the switching thin-film transistor (TFT) T2 and a driving voltage line PL and may store a voltage corresponding to a voltage difference between a voltage transmitted from the switching thin-film transistor (TFT) T2 and a first power supply voltage ELVDD supplied to the driving voltage line PL.

The driving thin-film transistor (TFT) T1 may be connected to the driving voltage line PL and the storage capacitor Cst and may control a driving current flowing from the driving voltage line PL to the organic light-emitting diode (OLED) in response to the voltage stored in the storage capacitor Cst. The organic light-emitting diode (OLED) may emit light having certain brightness by using a driving current. An opposite electrode (e.g., a cathode) of the organic light-emitting diode (OLED) may receive a second power supply voltage ELVSS.

FIG. 4 illustrates that the pixel circuit PC includes two thin-film transistors and one storage capacitor, but embodiments are not limited thereto. The number of thin-film transistors and the number of storage capacitors may be changed in various ways according to the design of the pixel circuit PC.

Referring back to FIG. 3, the third area AR3 may surround the first area AR1. The third area AR3 that is an area in which no display element such as the organic light-emitting diode (OLED) for emitting light is located, and signal lines that provide a signal to the pixels P around the first area AR1 may pass through the third area AR3.

A scan driver 1100 for providing a scan signal to each pixel P, a data driver 1200 for providing a data signal to each pixel P, and a main power supply line for providing first and second power supply voltages may be arranged in the fourth area AR4. FIG. 4 illustrates that the data driver 1200 is adjacent to one side of the substrate 100. However, according to some example embodiments, the data driver 1200 may be arranged on a flexible printed circuit board (FPCB) electrically connected to a pad arranged on one side of the display panel 10.

Figure 5A:
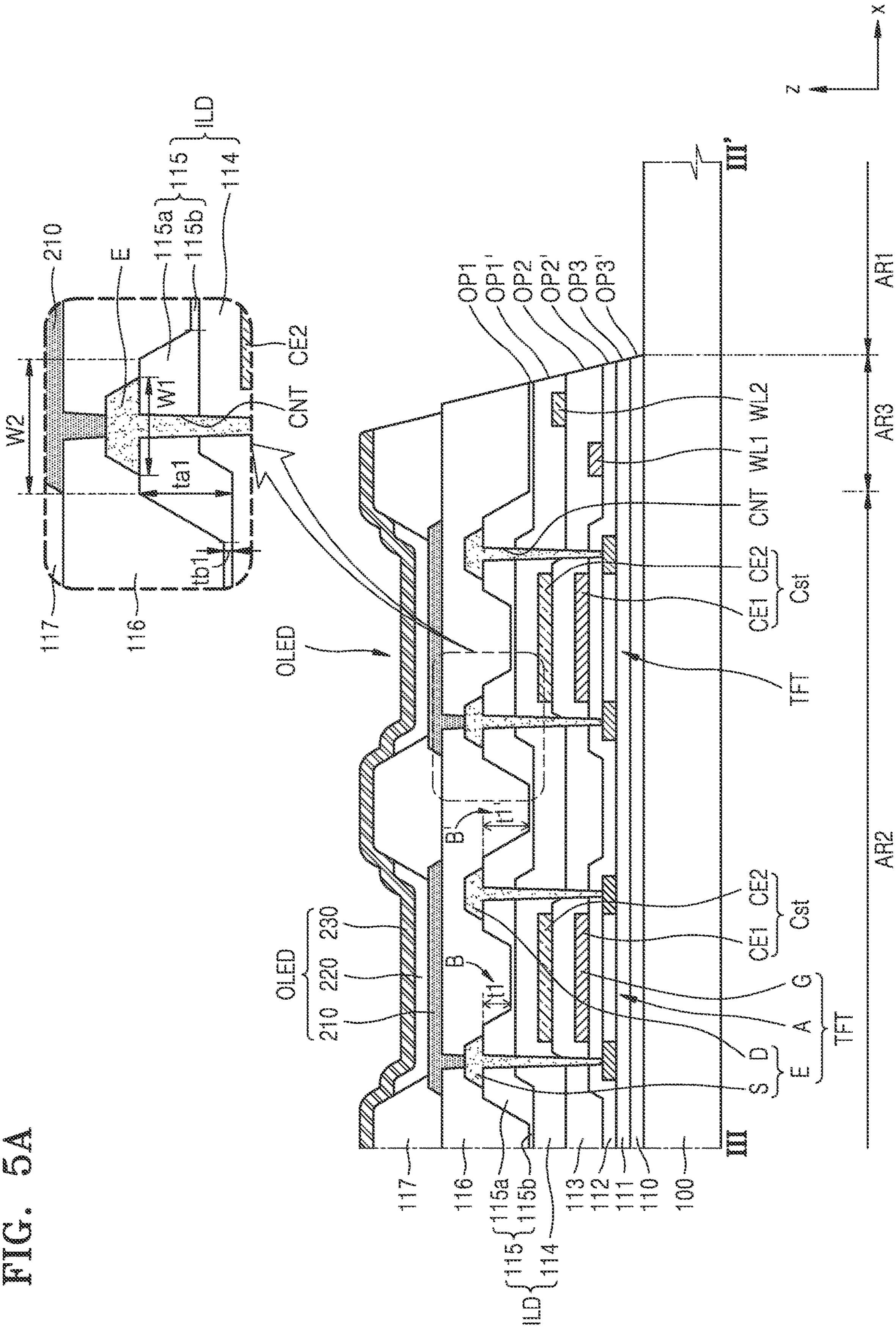
FIG. 5A is a cross-sectional view schematically illustrating the display panel cut along the line III-III' of FIG. 3.
Figure 5B:
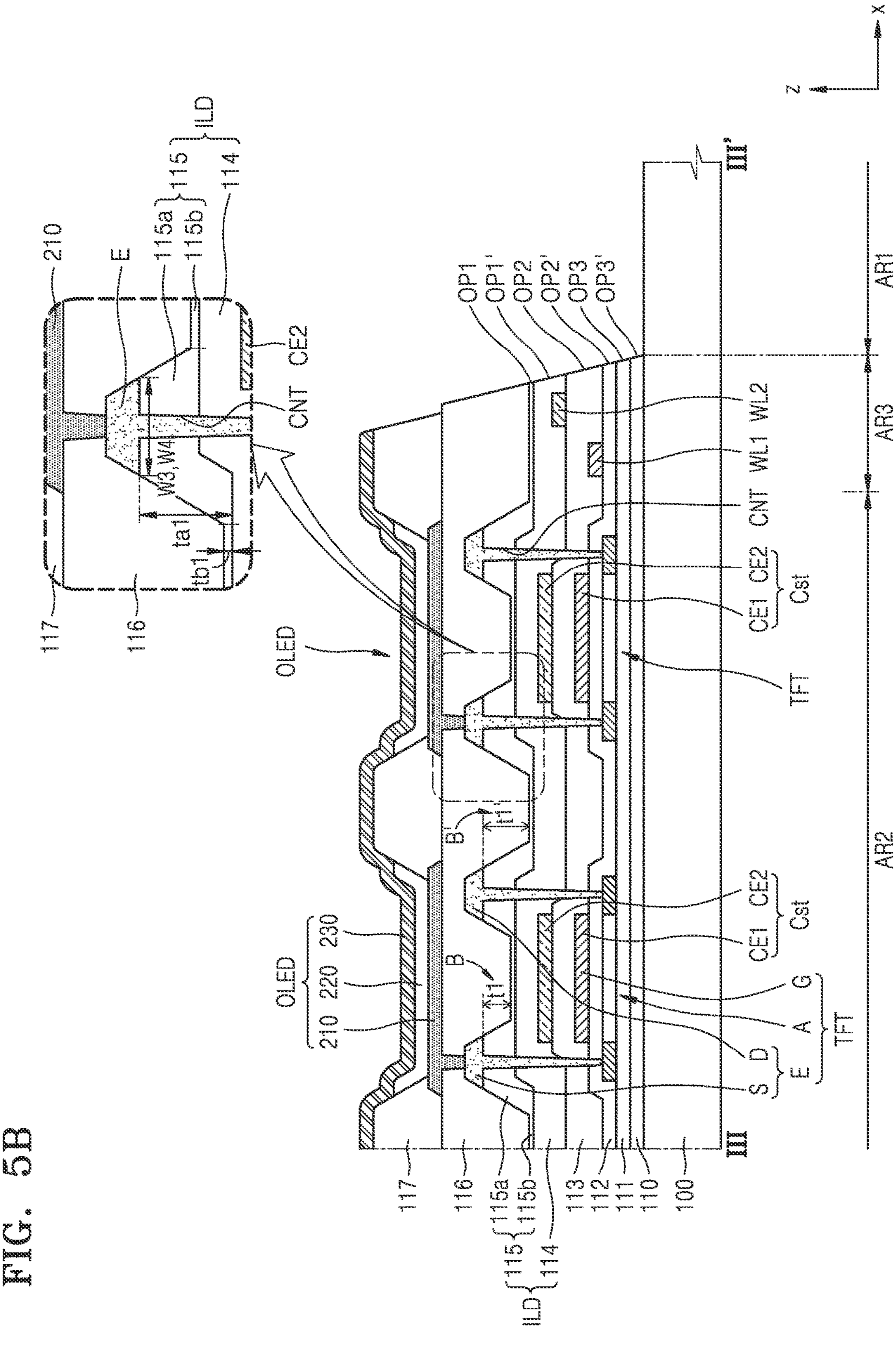
FIG. 5B is a cross-sectional view schematically illustrating the display panel cut along the line III-III' of FIG. 3.
Figure 5C:
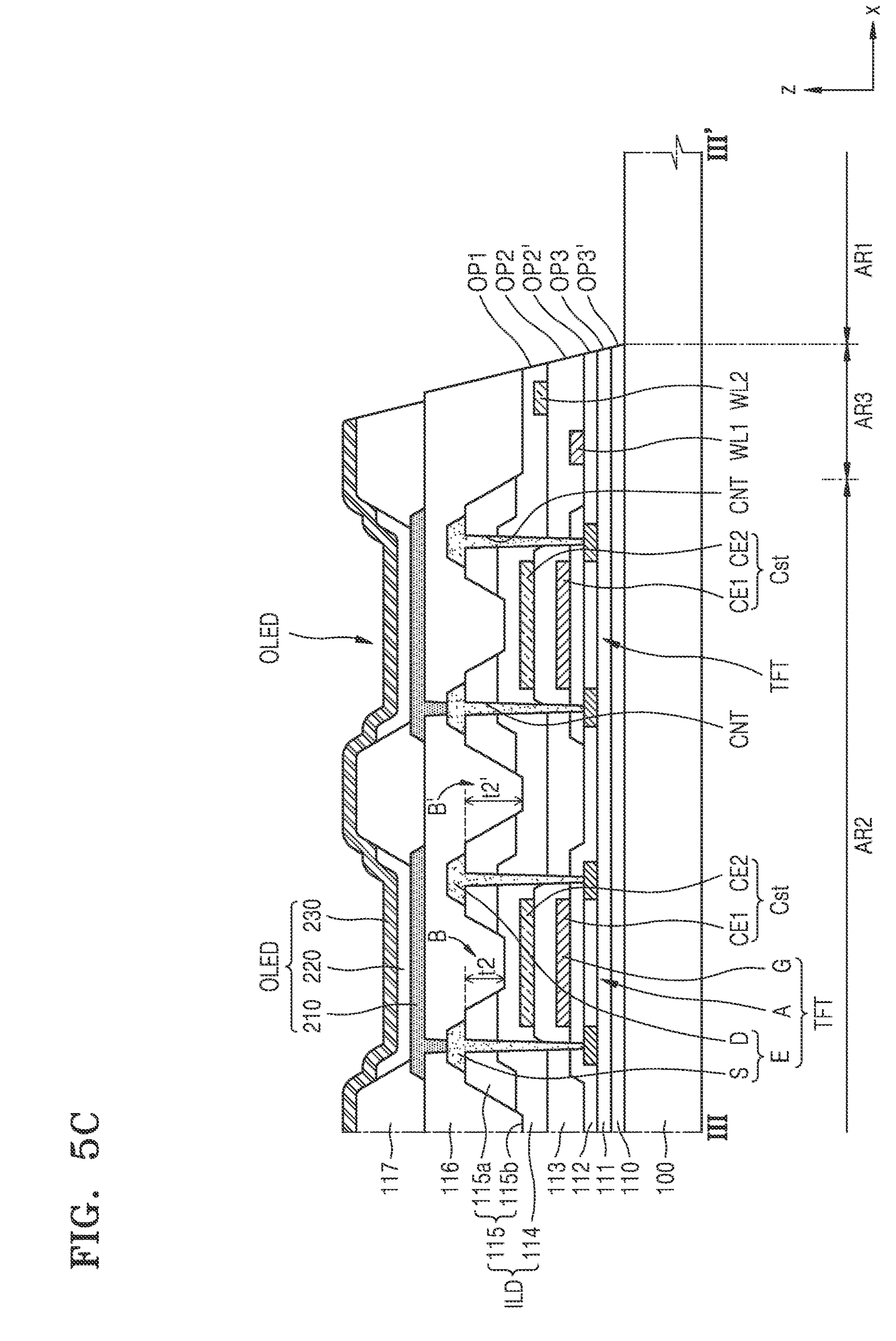
FIG. 5C is a cross-sectional view schematically illustrating the display panel cut along the line III-III' of FIG. 3.

FIGS. 5A through 5C are cross-sectional views schematically illustrating the display panel cut along the line III-III' of FIG. 3. FIGS. 5A and 5B correspond to some modified embodiments of FIG. 5A and thus will be described based on FIG. 5A, and FIGS. 5B and 5C will be described below based on a difference between FIGS. 5B and 5C and 5A.

Referring to FIG. 5A, the display apparatus (see 1 of FIG. 1) according to some example embodiments may include a semiconductor layer A arranged on the substrate 100, gate insulating layers 112 and 113, an interlayer insulating layer ILD, and an organic light-emitting diode (OLED) that is a display element. The interlayer insulating layer ILD may include a first interlayer insulating layer 114 and a second interlayer insulating layer 115.

According to some example embodiments, the display apparatus 1 may further include an electrode layer E arranged on the second interlayer insulating layer 115 and electrically connected to the semiconductor layer A. The second interlayer insulating layer 115 may include a first portion 115*a* and a second portion 115*b* that extends from the first portion 115*a*, and the electrode layer E may be arranged on a first portion 115*a* of the second interlayer insulating layer 115. At this time, steps t1 and t1' may be provided by a difference in thicknesses ta1 and tb1 of the first portion 115*a* and the second portion 115*b* of the second interlayer insulating layer 115.

Also, according to some example embodiments, the thickness ta1 of the first portion 115*a* of the second interlayer insulating layer 115 may be greater than the thickness tb1 of the second portion 115*b* of the second interlayer insulating layer 115.

According to some example embodiments, a width w2 of a top surface of the first portion 115*a* of the second interlayer insulating layer 115 may be greater than a width w1 of a bottom surface of the electrode layer E.

Hereinafter, a configuration included in the display apparatus 1 will be described in more detail with reference to FIG. 5A according to a stack order.

The substrate 100 includes the first area AR1, the second area AR2, and the third area AR3 between the first area AR1 and the second AR2. The thin-film transistor (TFT) and the organic light-emitting diode (OLED) connected thereto may be arranged in the second area AR2, and some wirings WL1 and WL2 may be positioned in the third area AR3. The second area AR2 may be a display area in which light is emitted, and the third area AR3 may be a non-display area in which no light is emitted. Hereinafter, a description will be given focusing on the second area AR2.

The substrate 100 may include a glass material, a ceramic material, a metal material, or a flexible or bendable material. When the substrate 100 is flexible or bendable, the substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single layer or multi-layer structure of the material described above, and when the substrate 100 has a multi-layer structure, the substrate 100 may further include an inorganic layer. In some example embodiments, the substrate 100 may have the structure of an organic material/inorganic material/organic material.

Buffer layers 110 and 111 may be arranged on the substrate 100 and may have a single layer or multi-layer structure. The buffer layers 110 and 111 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

According to some example embodiments, the buffer layers 110 and 111 may include a first buffer layer 110 and a second buffer layer 111, and the first buffer layer 110 may include silicon oxide ($SiN_x$), and the second buffer layer 111 may include silicon oxide ($SiO_2$). At this time, the second buffer layer 111 may be thicker than the first buffer layer 110.

A barrier layer may be further included between the substrate 100 and the buffer layers 110 and 111. The barrier layer may prevent an impurity from penetrating into a semiconductor layer A from the substrate 100 or may minimize penetration. The barrier layer may include an inorganic material such as oxide or nitride, an organic material, or an organic/inorganic composite material and may have a single layer or multi-layer structure of the inorganic material and the organic material.

The semiconductor layer A may be arranged on the buffer layers 110 and 111. The semiconductor layer A may include amorphous silicon or polysilicon. According to some example embodiments, the semiconductor layer A may include at least one oxide selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer A may include a channel area, and a source area and a drain area, which are at both sides of the channel area. The semiconductor layer A may have a single layer or multi-layer structure.

A first gate insulating layer 112 and a second gate insulating layer 113 may be stacked on the substrate 100 so as to cover the semiconductor layer A. The first gate insulating layer 112 and the second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A gate electrode G may be arranged on the first gate insulating layer 112 so that at least part of the gate electrode G may overlap the semiconductor layer A. That is, the first gate insulating layer 112 may be arranged between the semiconductor layer A and the gate electrode G.

In the drawings, the gate electrode G is arranged on the first gate insulating layer 112. However, according to some example embodiments, the gate electrode G may be arranged on a top surface of the second gate insulating layer 113. Also, gate electrodes G of a plurality of thin-film transistors (TFTs) may be arranged on the same layer or different layers.

A lower electrode CE1 of the storage capacitor Cst of the same material as that of the gate electrode G may be arranged on the first gate insulating layer 112. An upper electrode CE2 of the storage capacitor Cst may overlap the lower electrode CE1 with the second gate insulating layer 113 therebetween and may form a capacitance. In this case, the second gate insulating layer 113 may function as a dielectric layer of the storage capacitor Cst.

As shown in FIG. 5A, the lower electrode CE1 of the storage capacitor Cst may overlap the thin-film transistor (TFT). For example, the gate electrode G of the thin-film transistor (TFT) may function as the lower electrode CE1 of the storage capacitor Cst.

An interlayer insulating layer ILD may be provided on the second gate insulating layer 113 so as to cover the upper electrode CE2 of the storage capacitor Cst. The interlayer insulating layer ILD may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

According to some example embodiments, the interlayer insulating layer ILD may include a first interlayer insulating layer 114 and a second interlayer insulating layer 115, and the first interlayer insulating layer 114 may include silicon oxide ($SiO_2$), and the second interlayer insulating layer 115 may include silicon nitride ($SiN_x$). At this time, the second interlayer insulating layer 115 may be thicker than the first interlayer insulating layer 114.

Also, according to some example embodiments, the second interlayer insulating layer 115 may include a first portion 115*a* and a second portion 115*b* that extends from the first portion 115*a*, and a thickness ta1 of the first portion 115*a* may be greater than a thickness tb1 of the second portion 115*b*.

An electrode E may be arranged on the interlayer insulating layer ILD. The electrode layer E may include a source electrode S, a drain electrode D, and the data line (see DL of FIG. 3).

The source electrode S, the drain electrode D, and the data line DL may include a conductive material including molybdenum (Mo), aluminum (Al), copper (Cu), and titanium (Ti), and may have a single layer or multi-layer structure including the material described above. According to some example embodiments, the source electrode S, the drain electrode D, and the data line DL may have a multi-layer structure of Ti/Al/Ti. The source electrode S and the drain electrode D may be connected to the source area or the drain area of the semiconductor layer A through a contact hole CNT.

The source electrode Sand the drain electrode D may be covered by an inorganic protective layer. The inorganic protective layer may be a single layer or multi-layer of silicon nitride ($SiN_x$) and silicon oxide ($SiO_x$). The inorganic protective layer may be introduced to cover and protect some wirings arranged on the interlayer insulating layer ILD.

A planarization layer 116 may be arranged to cover the source electrode S and the drain electrode D, and an organic light-emitting diode (OLED) may be arranged on the planarization layer 116.

The planarization layer 116 may have a single layer or multi-layer structure of an organic material and may provide a flat top surface. The planarization layer 116 may include general-purpose polymer such as benzo cyclobutene (BCB), polyimide, hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, a p-xylene-based polymer, vinyl alcohol-based polymer, and a blend thereof.

The organic light-emitting diode (OLED) may be arranged on the planarization layer 116. The organic light-emitting diode (OLED) may include a pixel electrode 210, an intermediate layer 220 including an organic emission layer, and an opposite electrode 230.

The pixel electrode 210 may be a (semi-)transparent electrode or a reflective electrode. In some example embodiments, the pixel electrode 210 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), and a compound thereof and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some example embodiments, the pixel electrode 210 may include ITO/Ag/ITO.

In the second area AR2 of the substrate 100, a pixel-defining layer 117 may be arranged on the planarization layer 116. Also, the pixel-defining layer 117 may increase a distance between the edge of the pixel electrode 210 and the opposite electrode 230 above the pixel electrode 210, thereby preventing or reducing instances of an arc occurring in the edge of the pixel electrode 210.

The pixel-defining layer 117 may be formed of one or more organic insulating materials selected from the group consisting of polyimide, polyamide, acrylic resin, and BCB, and phenol resin by a method such as spin coating.

The intermediate layer 220 of the organic light-emitting diode (OLED) may include an organic emission layer. The organic emission layer may include an organic material including a fluorescent or phosphorescent material that emits red, green, blue, or white light. The organic emission layer may include a small molecular weight organic material or a polymer organic material, and a functional layer such as a hole transport layer (HTL), a hole injection layer (HIL), an electron transport layer (ETL), or an electron injection layer (EIL), may be selectively further arranged under and on the organic emission layer. The intermediate layer 220 may be arranged to correspond to each of a plurality of pixel electrodes 210. However, embodiments according to the present disclosure are not limited thereto. The intermediate layer 220 may be variously modified such as including a layer integrally over the plurality of pixel electrodes 210.

The opposite electrode 230 may be a transparent electrode or reflective electrode. In some example embodiments, the opposite electrode 230 may be a transparent or semi-transparent electrode and may be formed of a metal thin layer having a small work function and including lithium (Li), calcium (Ca), LiF/Ca, LiF/Al, Al, Ag, Mg, and a compound thereof. Also, a transparent conductive oxide (TCO) layer such as ITO, IZO, ZnO or $In_2O_3$ may be further arranged on the metal thin layer. The opposite electrode 230 may be arranged over the second area AR2 and may be arranged on the intermediate layer 220 and the pixel-defining layer 117. The opposite electrode 230 may be formed integrally with a plurality of organic light-emitting diodes OLED and may correspond to the plurality of pixel electrodes 210.

According to some example embodiments, the second interlayer insulating layer 115 may include a first portion 115*a* and a second portion 115*b* that extends from the first portion 115*a*. This will be described in more detail with reference to the configuration of FIGS. 5A through 5C.

The interlayer insulating layer ILD may include a first interlayer insulating layer 114 and a second interlayer insulating layer 115, and the second interlayer insulating layer 115 may include the first portion 115*a* and the second portion 115*b* that extends from the first portion 115*a*. Also, steps t1, t1', t2, and t2' may be provided by a difference in thicknesses ta1 and tb1 of the first portion 115*a* and the second portion 115*b*.

As shown in the drawings, the second interlayer insulating layer 115 may include the first portion 115*a* and the second portion 115*b*, and a shape having the steps t1, t1', t2, and t2' may be repeated.

FIGS. 5A and 5B illustrate, in the steps t1 and t1' of the first portion 115*a* and the second portion 115*b* of the second interlayer insulating layer 115, the step t1' of portion B' is greater than the step t1 of portion B.

The second interlayer insulating layer 115 may have a curved shape by the patterned gate electrode G, like the first interlayer insulating layer 114. The curved shape may be reflected on the steps t1 and t1' so that the step t1 of portion B may be different from the step t1' of portion B'.

According to some example embodiments, the step t1 of portion B and the step t1' of portion B' may be the same so that the steps t1 and t1' of the first portion 115*a* and the second portion 115*b* of the second interlayer insulating layer 115 may be formed uniformly.

Although described based on FIGS. 5A and 5B, like in FIG. 5C, steps t2 and t2' of the first portion 115*a* and the second portion 115*b* of the second interlayer insulating layer 115 may be formed differently with a step t2 of portion B and a step t2' of portion B', respectively. Also, unlike in the drawings, the steps t2 and t2' of the first portion 115*a* and the second portion 115*b* of the second interlayer insulating layer 115 may be constant.

According to some example embodiments, the first interlayer insulating layer 114 may include silicon oxide ($SiO_2$), and the second interlayer insulating layer 115 may include silicon nitride ($SiN_x$). At this time, the second interlayer insulating layer 115 may be thicker than the first interlayer insulating layer 114. According to some example embodiments, the thickness of the first interlayer insulating layer 114 may be about 1000 Å to about 3000 Å, for example, about 2000 Å. Also, the thickness of the second interlayer insulating layer 115 may be about 2000 Å to about 4000 Å, for example, about 3000 Å.

A contact hole CNT may be provided to pass through the gate insulating layers 112 and 113 and the interlayer insulating layer ILD and to expose part of the semiconductor layer A. An electrode layer E may be provided to be electrically connected to the semiconductor layer A through the contact hole CNT. At this time, the electrode layer E may be arranged on the first portion 115*a* of the second interlayer insulating layer 115.

Referring to the enlarged view of FIG. 5A, because the electrode layer E may have a trapezoidal shape, bottom and top surfaces of the electrode layers E facing each other may be parallel. At this time, a wider portion of the bottom and top surfaces of the electrode layer E corresponds to the bottom surface of the electrode layer E.

Also, the bottom surface of the electrode layer E may be in contact with the top surface of the first portion 115*a* of the second interlayer insulating layer 115. According to some example embodiments, a width w2 of the top surface of the first portion 115*a* of the second interlayer insulating layer 115 may be greater than a width w1 of the bottom surface of the electrode layer E.

FIG. 5A illustrates that the width w2 of the top surface of the first portion 115*a* of the second interlayer insulating layer 115 is different from the width w1 of the bottom surface of the electrode layer E. However, referring to the enlarged view of FIG. 5B, a width w4 of a top surface of the first portion 115*a* of the second interlayer insulating layer 115 may be the same as a width w3 of the bottom surface of the electrode layer E. That is, a side surface of the electrode layer E and a side surface of the first portion 115*a* of the second interlayer insulating layer 115 may be located on the same plane.

According to some example embodiments, a thickness ta1 of the first portion 115*a* of the second interlayer insulating layer 115 may be greater than a thickness tb1 of the second portion 115*b* of the second interlayer insulating layer 115. According to some example embodiments, the thickness ta1 of the first portion 115*a* of the second interlayer insulating layer 115 may be about 2000 Å to about 4000 Å, for example, about 3000 Å. Also, the thickness tb1 of the second portion 115*b* of the second interlayer insulating layer 115 may be about 1500 Å or less.

The step t2 of the first portion 115*a* and the second portion 115*b* of the second interlayer insulating layer 115 shown in FIG. 5C may be greater than the step t1 of the first portion 115*a* and the second portion 115*b* of the second interlayer insulating layer 115 shown in FIG. 5A. In this case, the top surface of the first interlayer insulating layer 114 corresponding to the second portion 115*b* of the second interlayer insulating layer 115 may be exposed.

As shown in FIG. 5C, part of the top surface of the first interlayer insulating layer 114 corresponding to the second portion 115*b* of the second interlayer insulating layer 115 may be removed. According to some example embodiments, all of the second portion 115*b* of the second interlayer insulating layer 115 may be removed so that the second portion 115*b* of the second interlayer insulating layer 115 and the top surface of the first interlayer insulating layer 114 corresponding to the second portion 115*b* may coincide with each other.

FIGS. 5A through 5C illustrate that the first portion 115*a* of the second interlayer insulating layer 115 has a trapezoidal shape, but the first portion 115*a* of the second interlayer insulating layer 115 may have a rectangular shape or may be variously modified.

As described above in FIGS. 2A through 2D, the component 20 may be located under the first area AR1. That is, the first area AR1 will be understood as a transmission area through which light or/and sound that is output from the component 20 to the outside or proceeding toward the component 20 from the outside may transmit. The component 20 may be an electronic element using light or sound, and may be a member other than the electronic element. Alternatively, the component 20 may include an element such as an accessory for increasing an aesthetic sense of the display panel 10.

According to some example embodiments, all of the buffer layers 110 and 111, the gate insulating layers 112 and 113, and the interlayer insulating layer ILD in the first area AR1 may be removed, so that the top surface of the substrate 100 corresponding to the first area AR1 may be exposed. That is, in correspondence with the first area AR1, the interlayer insulating layer ILD may have first openings OP1 and OP1', and the gate insulating layers 111 and 112 may have second openings OP2 and OP2', the buffer layers 110 and 111 may have third openings OP3 and OP3', and light or/and sound may transmit through the openings OP1, OP1', OP2, OP2', OP3, and OP3'.

Also, according to some example embodiments, the buffer layers 110 and 111 may include a first buffer layer 110 and a second buffer layer 111, and the first buffer layer 110 may include silicon nitride ($SiN_x$), and the second buffer layer 111 may include silicon oxide ($SiO_2$). At this time, the second buffer layer 111 may be thicker than the first buffer layer 110.

As a comparative example, a buffer layer may be formed of a single layer including silicon oxide ($SiO_2$), and the buffer layer may remain on the substrate corresponding to a transmission area. In this case, the refractive index of the remaining buffer layer is similar to the refractive index of a substrate so that there is no effect in transmission of light or/and sound.

However, when the buffer layer has a high temperature by the laser during an 'amorphous silicon laser crystallization' process, impurities preset in the substrate are diffused. At this time, when the buffer layer has a single layer structure, impurities may not be prevented, resulting in unstable device characteristics and a lower yield.

Unlike this, according to some example embodiments, the buffer layers 110 and 111 include the first buffer layer 110 including silicon nitride ($SiN_x$) and the second buffer layer 111 including silicon oxide ($SiO_2$), and when the top surface of the substrate 100 corresponding to the first area AR1 is exposed, there is no obstacle to the progress of light or/and sound, and there is no change in refractive index, and there is no effect on transmittance.

Also, when the buffer layers 110 and 111 has a high temperature by the laser during the 'amorphous silicon laser crystallization' process, impurities present in the substrate 100 are diffused. However, when the first buffer layer 110 and the second buffer layer 111 are arranged on the substrate 100, the penetration of impurities from the substrate 100 may be sufficiently prevented or reduced by the first buffer layer 110 and the second buffer layer 111.

Figure 6A:
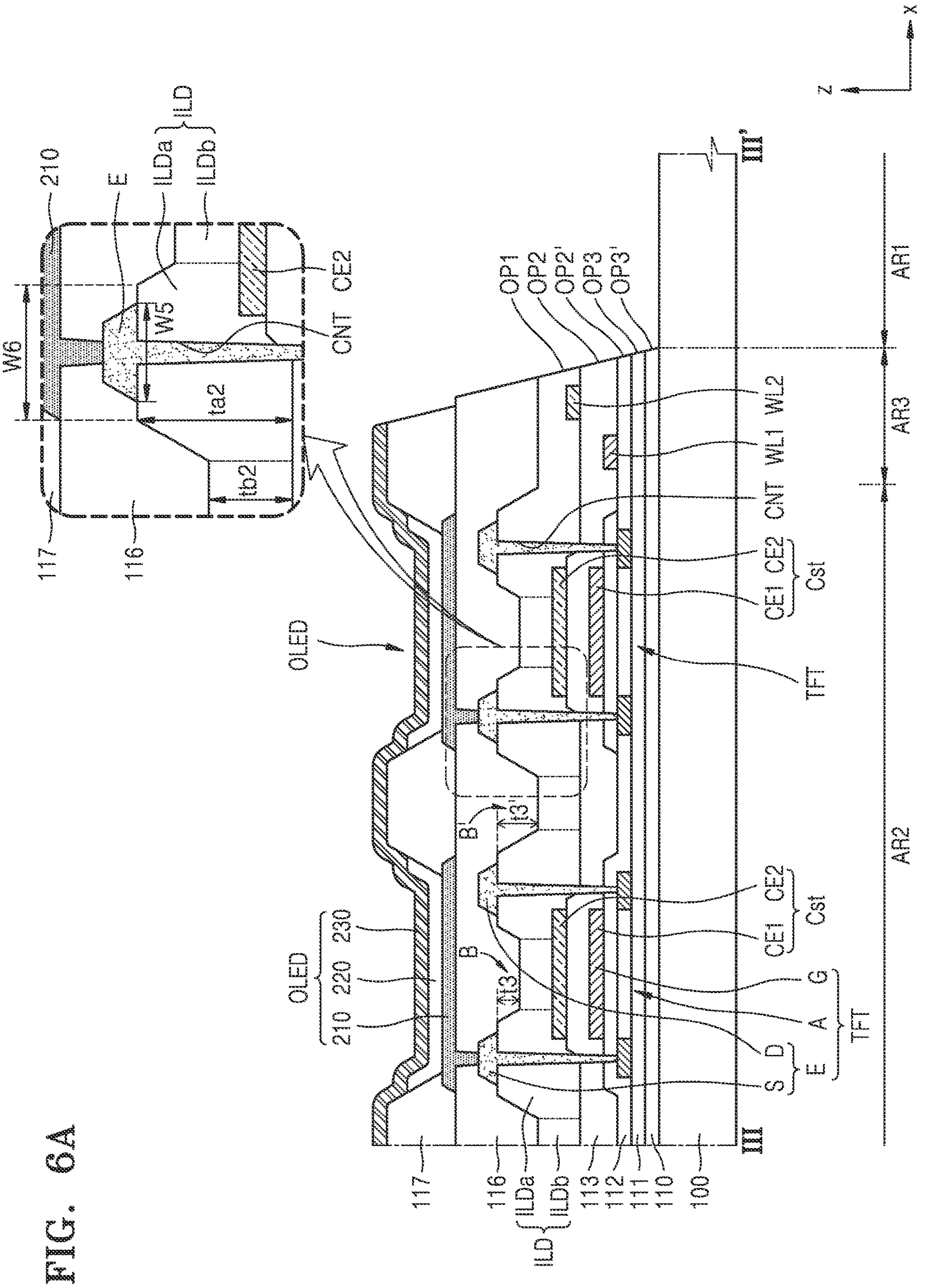
FIG. 6A is a cross-sectional view schematically illustrating the display panel cut along the line III-III' of FIG. 3.
Figure 6B:
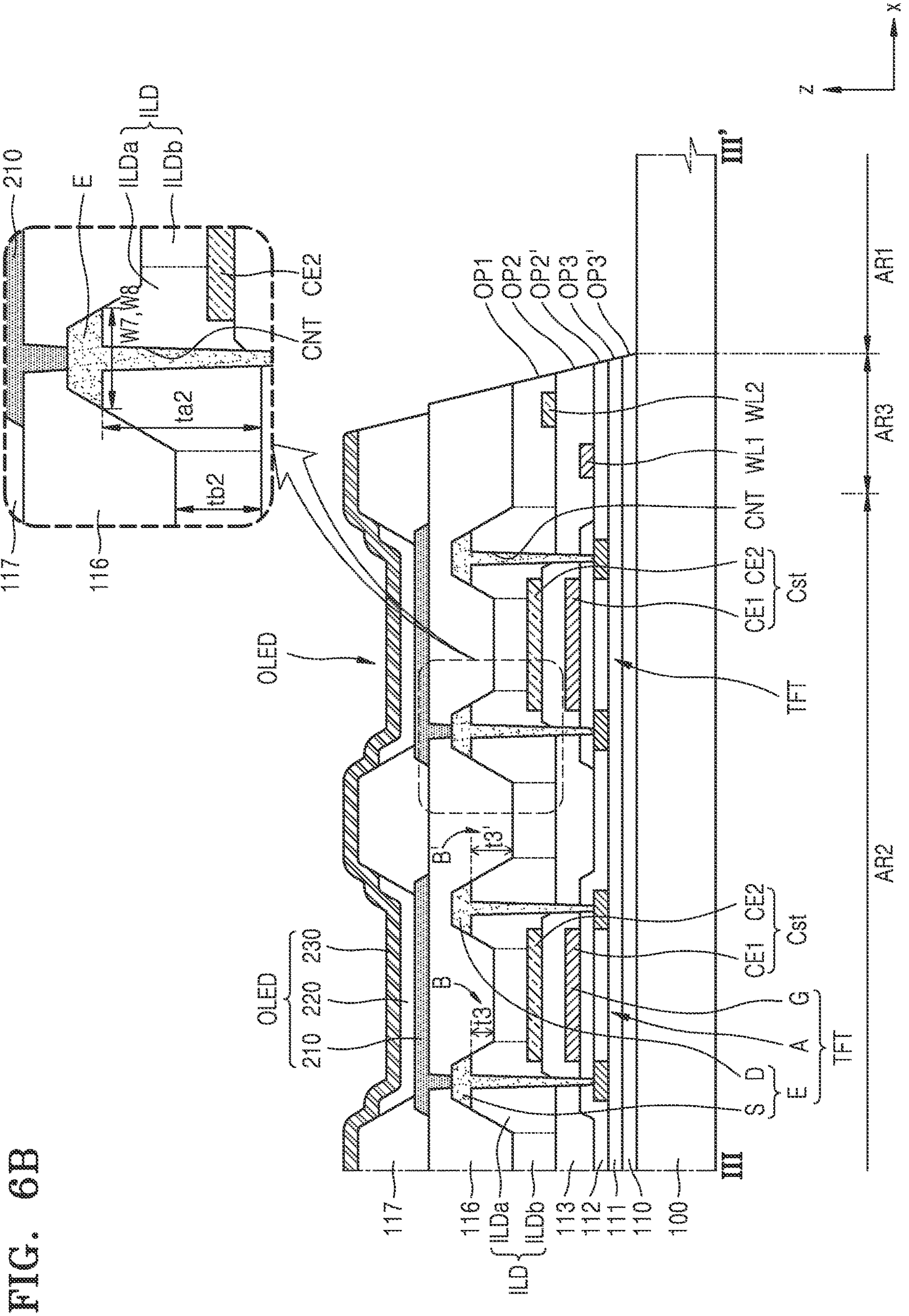
FIG. 6B is a cross-sectional view schematically illustrating the display panel cut along the line III-III' of FIG. 3.

FIGS. 6A and 6B are cross-sectional views schematically illustrating the display panel cut along the line III-III' of FIG. 3. In FIGS. 6A and 6B, like reference numerals in FIGS. 5A through 5C refer to like elements and thus, some redundant description thereof will be omitted.

A substrate 100 may include a first area AR1, a second area AR2, and a third area AR3 between the first area AR1 and the second area AR2. The second area AR2 may be a display area in which light is emitted, and the third area AR3 may be a non-display area in which no light is emitted.

Buffer layers 110 and 111, gate insulating layers 112 and 113, a thin-film transistor (TFT), a storage capacitor Cst, an interlayer insulating layer ILD, a planarization layer 116, and an organic light-emitting diode (OLED) that is a display element may be arranged on the substrate 100.

The buffer layers 110 and 111, the gate insulating layers 112 and 113, and the interlayer insulating layer ILD may include silicon oxide ($SiO_2$) and silicon nitride ($SiN_x$), and the planarization layer 116 may include general-purpose polymer, a polymer derivative having a phenol-based group, acryl-based polymer, imide-based polymer, aryl ether-based polymer, amide-based polymer, fluorine-based polymer, a p-xylene-based polymer, vinyl alcohol-based polymer, and a blend thereof.

FIGS. 5A through 5C illustrate that the interlayer insulating layer ILD includes a first interlayer insulating layer 114 and a second interlayer insulating layer 115. However, referring to FIGS. 6A and 6B, according to some example embodiments, the interlayer insulating layer ILD may have a single layer structure and may include silicon oxide ($SiO_2$).

The interlayer insulating layer ILD may include a first portion ILDa and a second portion ILDb that extends from the first portion ILDa, and steps t3 and t3' may be provided by a difference in thicknesses ta2 and tb2 between the first portion ILDa and the second portion ILDb.

As shown in the drawings, the interlayer insulating layer ILD may include the first portion ILDa and the second portion ILDb, and a shape having the steps t3 and t3' may be repeated.

The interlayer insulating layer ILD may have a curved shape by the patterned gate electrode G. The curved shape may be reflected on the steps t3 and t3' so that the step t3 of portion B and the step t3' of portion B' may be different from each other.

According to some example embodiments, the step t3 of portion B and the step t3' of portion B' may be the same so that the steps t3 and t3' of the first portion ILDa and the second portion ILDb of the interlayer insulating layer ILD may be formed constant.

By removing part of the gate insulating layers 112 and 113 and the interlayer insulating layer ILD, a contact hole CNT may be provided so that part of a semiconductor layer A may be exposed through the contact hole CNT. An electrode layer E may be provided to be electrically connected to the semiconductor layer A through the contact hole CNT. At this time, the electrode layer E may be arranged on the first portion ILDa of the interlayer insulating layer ILD.

Referring to the enlarged view of FIG. 6A, the electrode layer E may have a trapezoidal shape, and thus, bottom and top surfaces of the electrode layer E facing each other may be parallel. At this time, a wider portion of the bottom and top surfaces of the electrode layer E corresponds to the bottom surface of the electrode layer E.

Also, the bottom surface of the electrode layer E may be in contact with the top surface of the first portion ILDa of the interlayer insulating layer ILD. According to some example embodiments, a width w6 of the top surface of the first portion ILDa of the interlayer insulating layer ILD may be greater than a width w5 of the bottom surface of the electrode layer E.

FIG. 6A illustrates that the width w6 of the top surface of the first portion ILDa of the interlayer insulating layer ILD is different from the width w5 of the bottom surface of the electrode layer E. However, referring to the enlarged view of FIG. 6B, a width w8 of the top surface of the first portion ILDa of the interlayer insulating layer ILD and a width w7 of the bottom surface of the electrode layer E may be the same. That is, a side surface of the electrode layer E and a side surface of the first portion ILDa of the interlayer insulating layer ILD may be located on the same plane.

According to some example embodiments, a thickness ta2 of the first portion ILDa of the interlayer insulating layer ILD may be greater than a thickness tb2 of the second portion ILDb of the interlayer insulating layer ILD. According to some example embodiments, the thickness ta2 of the first portion ILDa of the interlayer insulating layer ILD may be about 4000 Å to about 6000 Å, for example, about 5000 Å. Also, the thickness tb2 of the second portion ILDb of the interlayer insulating layer ILD may be about 3000 Å or less.

A step t1 of the first portion 115*a* and the second portion 115*b* of the second interlayer insulating layer 115 shown in FIG. 5A may be greater than a step t3 of the first portion ILDa and the second portion ILDb of the interlayer insulating layer ILD shown in FIG. 6A (t1>t3). The second interlayer insulating layer 115 may include silicon nitride ($SiN_x$) and the single interlayer insulating layer ILD may include silicon oxide ($SiO_2$), which is derived from properties of these materials.

FIGS. 6A and 6B illustrate that the first portion ILDa of the interlayer insulating layer ILD has a trapezoidal shape, but the first portion ILDa of the interlayer insulating layer ILD may have a rectangular shape and may be variously modified.

According to some example embodiments, all of the buffer layers 110 and 111, the gate insulating layers 112 and 113, and the interlayer insulating layer ILD in the first area AR1 may be removed so that the top surface of the substrate 100 corresponding to the first area AR1 may be exposed. That is, in correspondence with the first area AR1, the interlayer insulating layer ILD may have first openings OP1 and OP1', and the gate insulating layers 111 and 112 may have second openings OP2 and OP2', the buffer layers 110 and 111 may have third openings OP3 and OP3', and light or/and sound may transmit through the openings OP1, OP1', OP2, OP2', OP3, and OP3'.

When the top surface of the substrate 100 corresponding to the first area AR1 is exposed, there is no obstacle to the progress of light or/and sound, and there is no change in refractive index, and there is no effect on transmittance.

Until now, only the display apparatus has been mainly descried, but embodiments are not limited thereto. For example, a method of manufacturing a display apparatus for manufacturing such a display apparatus will also fall within the scope of the present disclosure.

FIGS. 7A through 7E are cross-sectional views illustrating a method of manufacturing a display apparatus according to some example embodiments for each step, and FIG. 5A is taken as an example. In FIGS. 7A through 7E, like reference numerals in FIGS. 5A through 5C refer to like elements and thus, a redundant description thereof will be omitted.

Figure 7A:
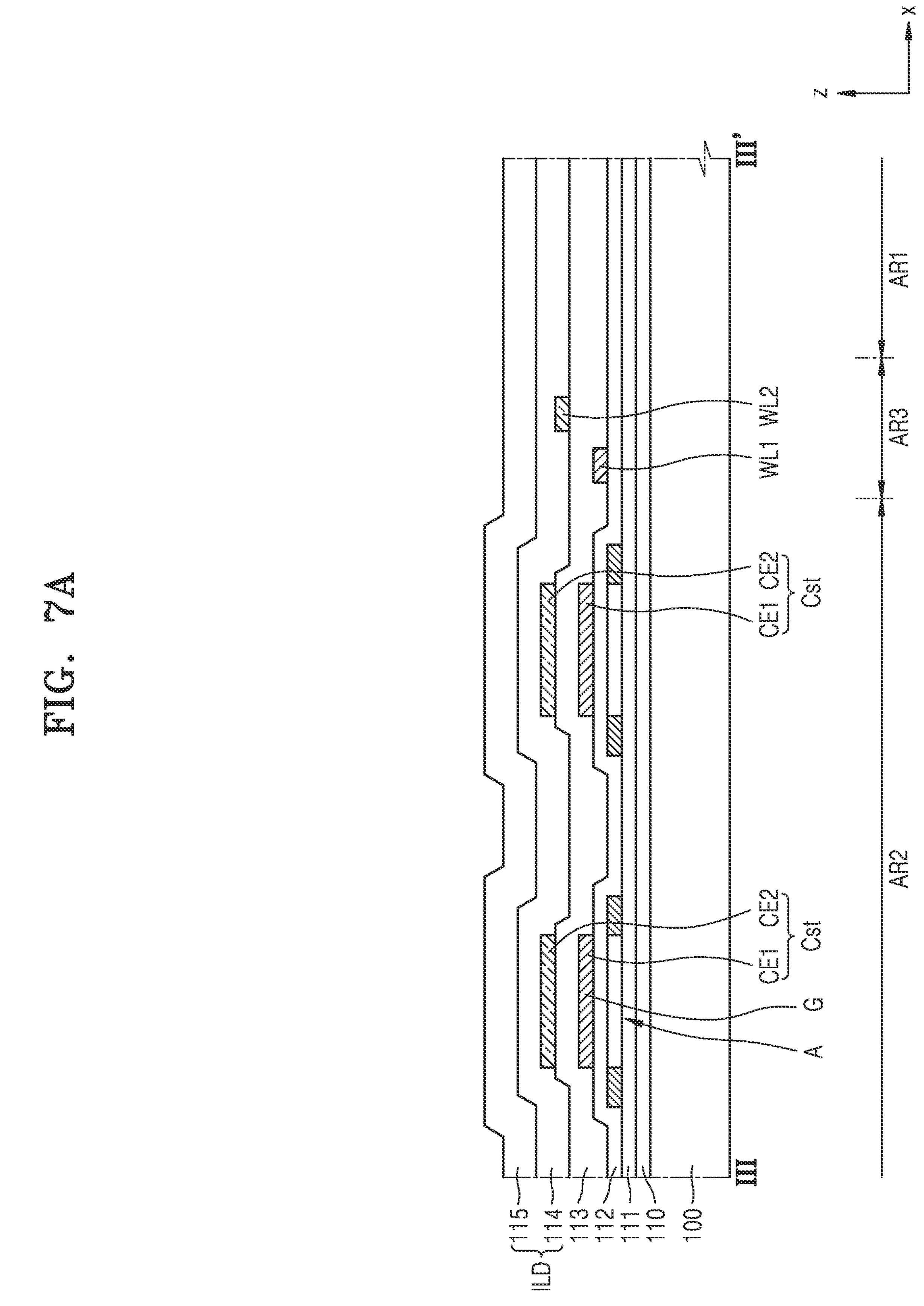
FIGS. 7A through 7E are cross-sectional views illustrating a method of manufacturing a display apparatus according to some example embodiments.

Referring to FIG. 7A, first, buffer layers 110 and 111, a semiconductor layer A, gate insulating layers 112 and 113, a gate electrode G of a thin-film transistor (TFT), a lower electrode CE1 and an upper electrode CE2 of a storage capacitor Cst, some wirings WL1 and WL2, and an interlayer insulating layer ILD may be sequentially formed on the substrate 100.

The buffer layers 110 and 111 may include silicon oxide ($SiO_2$) or silicon nitride ($SiN_x$) and may be formed through a deposition method, such as chemical vapor deposition (CVD), sputtering, etc.

The semiconductor layer A may be formed by patterning a pre-semiconductor layer. The pre-semiconductor layer may include amorphous silicon or an oxide semiconductor and may be deposited through CVD. Also, when the pre-semiconductor layer is an amorphous silicon layer, after the amorphous silicon layer has been formed, the amorphous silicon layer may be crystallized using various methods, such as rapid thermal annealing (RTA), solid phase crystallization (SPC), excimer laser annealing (ELA), metal induced crystallization (MIC), metal induced lateral crystallization (MILC), and sequential lateral solidification (SLS) and thus may be formed as a polycrystalline silicon layer.

The gate insulating layers 112 and 113 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed through a deposition method such as CVD, sputtering, or the like, and embodiments are not limited thereto.

The gate electrode G, the lower electrode CE1 and the first wiring WL1 of the storage capacitor Cst may include the same material. In order to form the gate electrode G, the lower electrode CE1 of the storage capacitor Cst and the first wiring WL1, a metal layer may be formed on the entire surface of the substrate 100 and then may be patterned. The metal layer may be formed using a deposition method such as plasma enhanced CVD (PECVD), low pressure CVD (LPCVD), physical vapor deposition (PVD), sputtering, atomic layer deposition (ALD). Embodiments are not limited thereto.

A second gate insulating layer 113 may be formed on the entire surface of the substrate 100 to cover the gate electrode G, the lower electrode CE1 of the storage capacitor Cst and the first wiring WL1, and an upper electrode CE2 of the storage capacitor Cst and a second wiring WL2 may be formed on the second gate insulating layer 113. A method of forming the upper electrode CE2 of the storage capacitor Cst and the second wiring WL2 is the same as a method of forming the gate electrode G, the lower electrode CE1 of the storage capacitor Cst, and the first wiring WL1 described above.

An interlayer insulating layer ILD may be formed on the entire surface of the substrate 100 to cover the upper electrode CE2 of the storage capacitor Cst and the second wiring WL2. The interlayer insulating layer ILD may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed through a deposition method such as CVD, sputtering, etc. Embodiments are not limited thereto.

According to some example embodiments, the interlayer insulating layer ILD may include a first interlayer insulating layer 114 and a second interlayer insulating layer 115, and the first interlayer insulating layer 114 may include silicon oxide ($SiO_2$), and the second interlay insulating layer 115 may include silicon nitride ($SiN_x$).

Figure 7B:
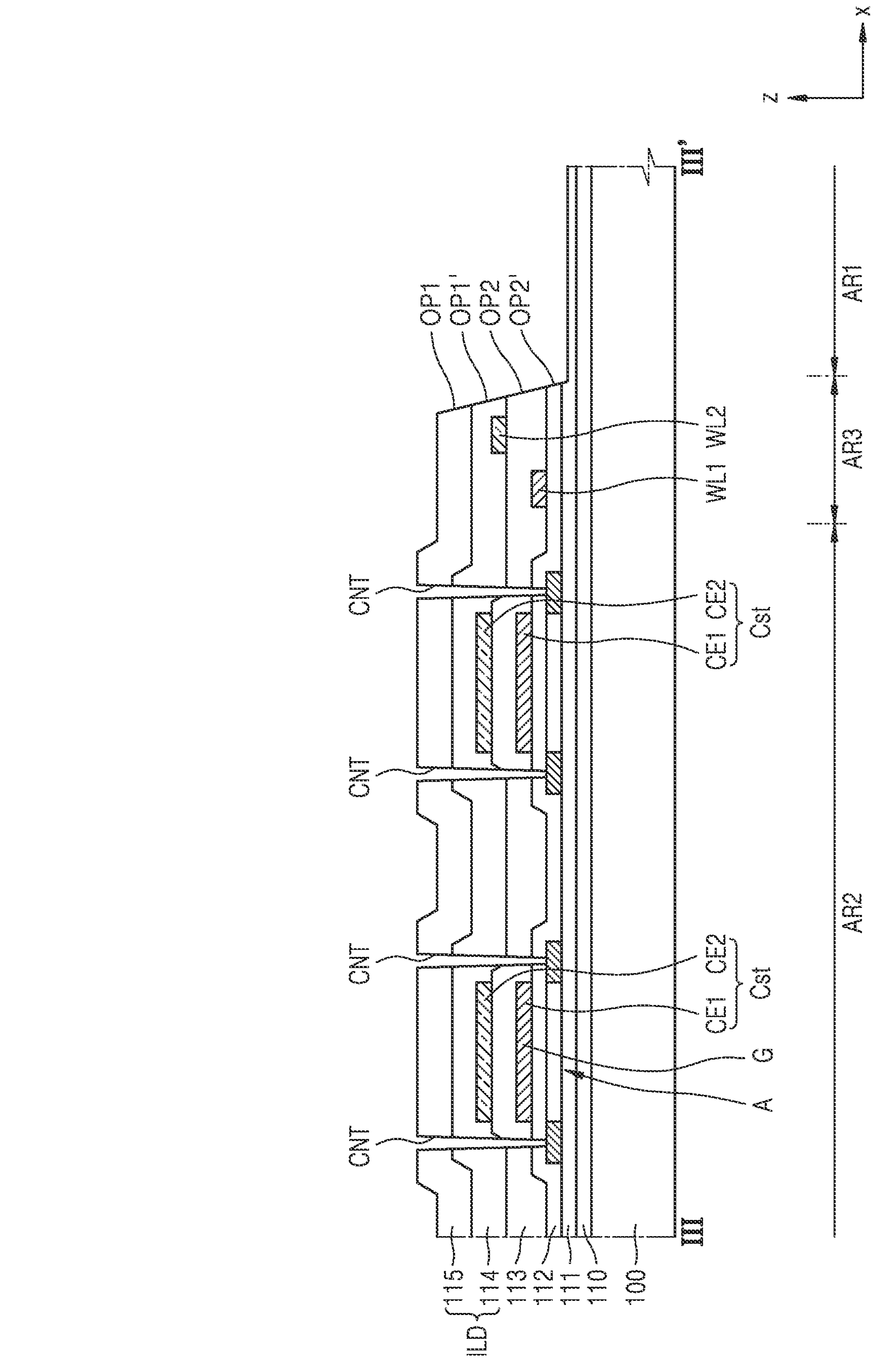

Referring to FIG. 7B, a contact hole CNT may be formed to pass through the gate insulating layers 112 and 113 and the interlay insulting layer ILD, so that a source area and/or a drain area of a semiconductor layer A may be exposed through the contact hole CNT.

The gate insulating layers 112 and 113 and the interlayer insulating layer ILD positioned on the first area AR1 may be removed together when the contact hole CNT is formed. That is, in correspondence with the first area AR1, the interlayer insulating layer ILD may have first openings OP1 and OP1', and the gate insulating layers 112 and 113 may have second openings OP2 and OP2'.

Also, as shown in the drawings, part of the second buffer layer 111 may be removed together. According to some example embodiments, the total thickness of the gate insulating layers 112 and 113, the interlayer insulating layer ILD, which are removed together when the contact hole CNT is formed, and the second buffer layer 111 may be about 7000 Å to about 11000 Å.

Figure 7C:
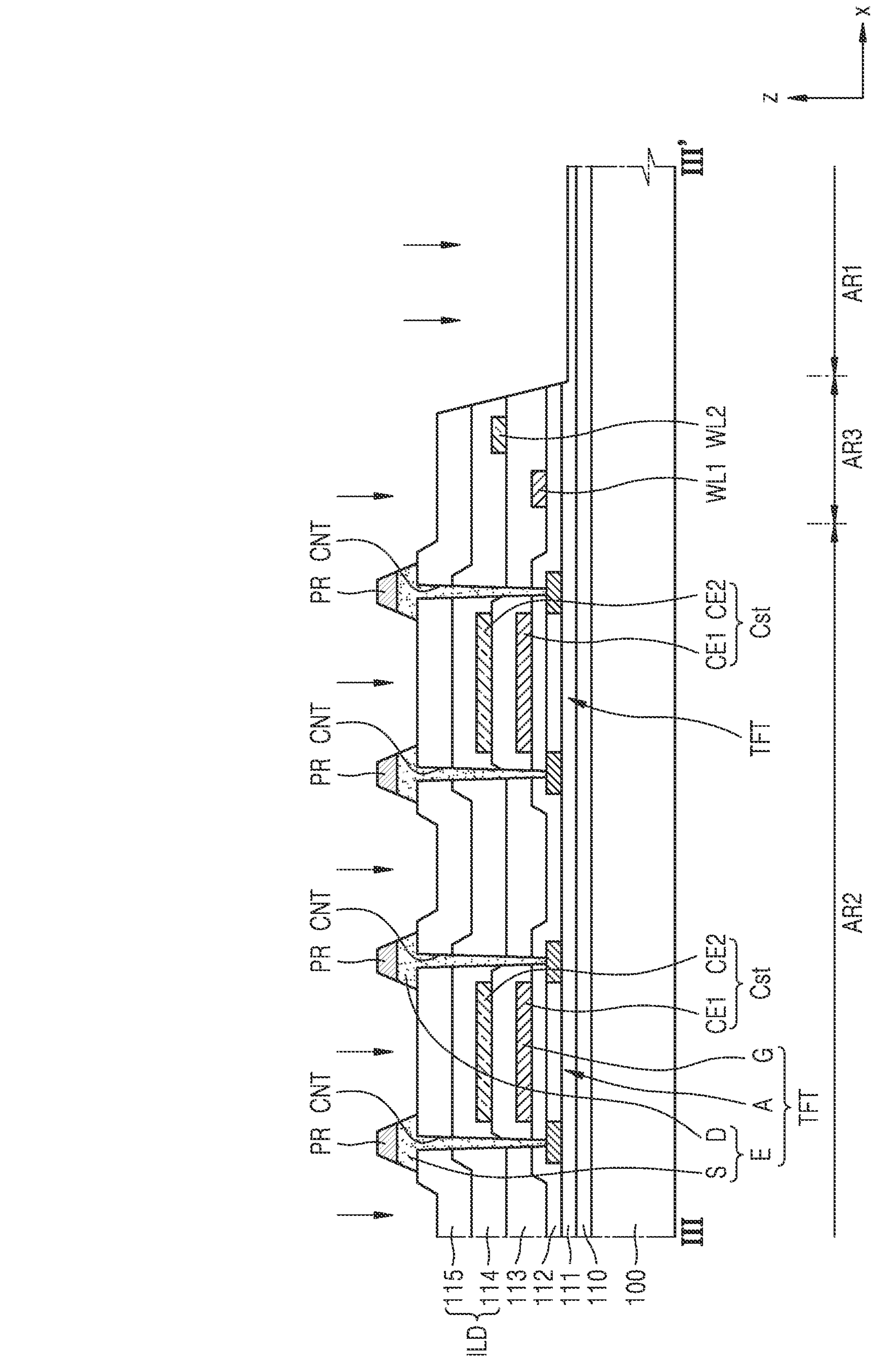

Referring to FIG. 7C, after an electrode layer E filling the contact hole CNT is formed on the interlayer insulating layer ILD, the electrode layer E may be etched using a photoresist pattern PR on the electrode layer E as a mask, so that a source electrode S and/or a drain electrode D may be formed.

The source electrode S and the drain electrode D may include a conductive material including Mo, Al, Cu, and Ti and may have a single layer or multi-layer structure including the material described above. According to some example embodiments, the source electrode S and the drain electrode D may have a multi-layer structure of Ti/Al/Ti.

After the electrode layer E is etched, cleaning the electrode layer E may be included so as to remove by-products around the electrode layer E generated during an etching process. At this time, when the electrode layer E is cleaned, oxygen ($O_2$) and carbon tetrafluoride ($CF_4$) may be used, and carbon tetrafluoride ($CF_4$) may serve to remove an inorganic layer such as the interlayer insulating layer ILD, the gate insulating layers 112 and 113, and the buffer layers 110 and 111.

According to some example embodiments, the ratio of oxygen ($O_2$) and carbon tetrafluoride ($CF_4$) may be similar to each other, and a bias voltage may be applied.

As a comparative example, oxygen ($O_2$) and carbon tetrafluoride ($CF_4$) are used in an electrode layer etching post-treatment operation. However, the amount of carbon tetrafluoride ($CF_4$) may be a very small amount compared to oxygen ($O_2$). In this case, by-products around the electrode layer E generated during the etching process may be removed, but the buffer layer located on the transmission area may not be removed. That is, a separate mask process is required to etch the buffer layer located on the transmission area, which increases cost and time.

Unlike this, according to some example embodiments, in the electrode layer E etching post-treatment operation, the ratio of oxygen ($O_2$) and carbon tetrafluoride ($CF_4$), which are different conditions from the comparative example, may be similar to each other, and a bias voltage may be applied.

In this case, the first portion (see 115*a* of FIG. 7D) of the second interlayer insulating layer 115 may be protected by a photoresist pattern PR, and the second portion (see 115*b* of FIG. 7D) of the second interlayer insulating layer 115 and the buffer layers 110 and 111 located on the first area AR1 may be etched by carbon tetrafluoride ($CF_4$). That is, part of the second portion 115*b* of the second interlayer insulating layer 115 may be etched so that steps t1 and t1' may be provided, and the buffer layers 110 and 111 may have third openings OP3 and OP3' in correspondence with the first area AR1.

Because cleaning of the electrode layer E and etching of the buffer layers 110 and 111 located on the first area AR1 may be simultaneously (or concurrently) performed, cost and time may be reduced, and the top surface of the substrate 100 corresponding to the first area AR1 is exposed so that transmittance may also be secured.

Figure 7D:
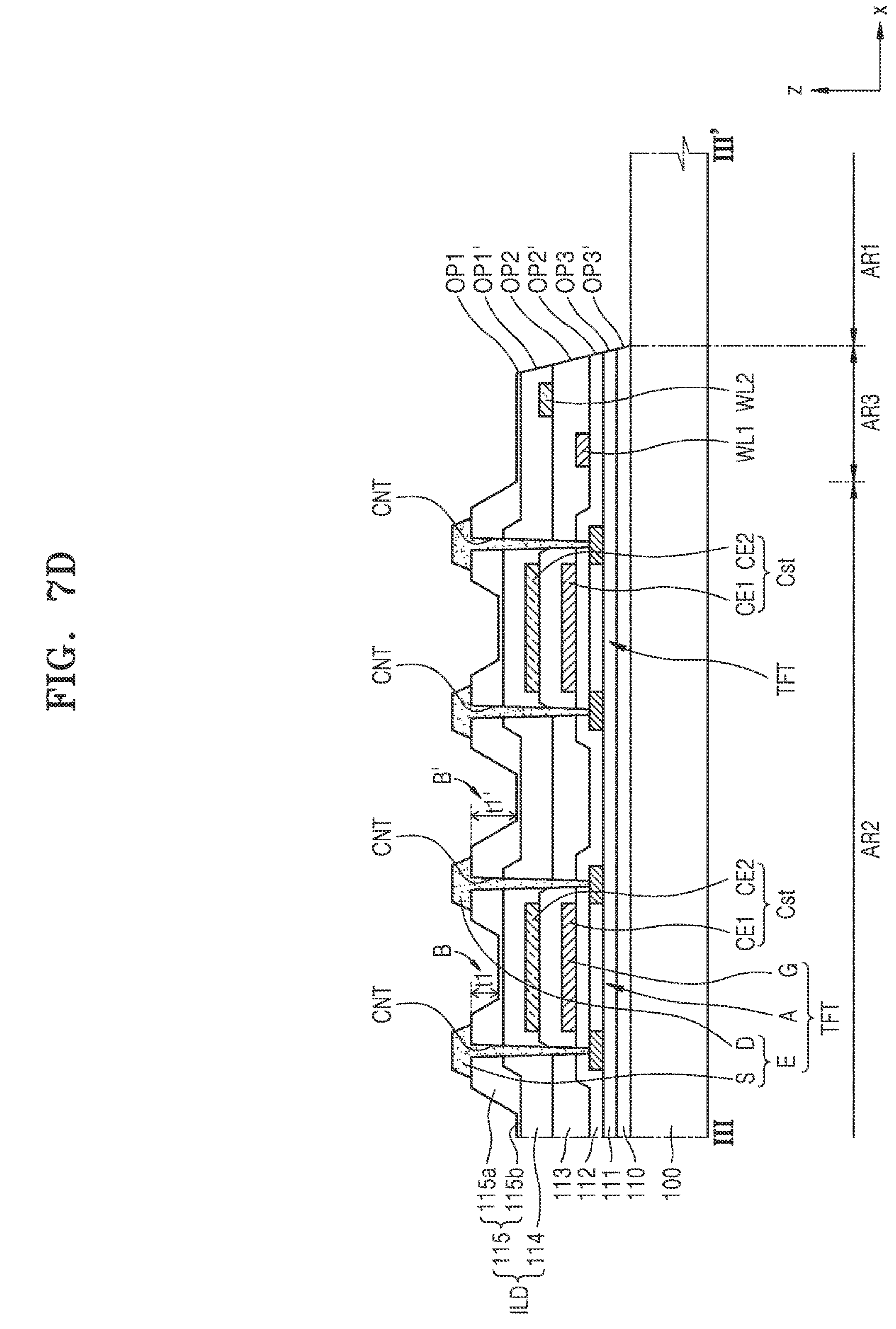

Referring to FIG. 7D, as described above in FIG. 5A, the second interlayer insulating layer 115 may include a first portion 115*a* and a second portion 115*b* that extends from the first portion 115*a*, and steps t1 and t1' may be provided by a difference in thicknesses ta1 and tb1 between the first portion 115*a* and the second portion 115*b*.

FIG. 7D illustrates that, in the steps t1 and t1' of the first portion 115*a* and the second portion 115*b* of the second interlayer insulating layer 115, the step t1 of portion B is greater than the step t1' of portion B'.

As shown in FIG. 7C, the second interlayer insulating layer 115 may have a curved shape by the patterned gate electrode G, like in the first interlayer insulating layer 114. Part of the second interlayer insulating layer 115 may be etched using the photoresist pattern PR arranged on the electrode layer E. At this time, an etching thickness may be the same as the step t1 of portion B, but a curved shape may be reflected in the steps t1 and t1' so that the step t1 of portion B and the step t1' of portion B' may be different from each other.

According to some example embodiments, the step t1 of portion B and the step t1' of portion B' may be the same so that the steps t1 and t1' of the first portion 115*a* and the second portion 115*b* of the second interlayer insulating layer 115 may be formed constant.

Figure 7E:
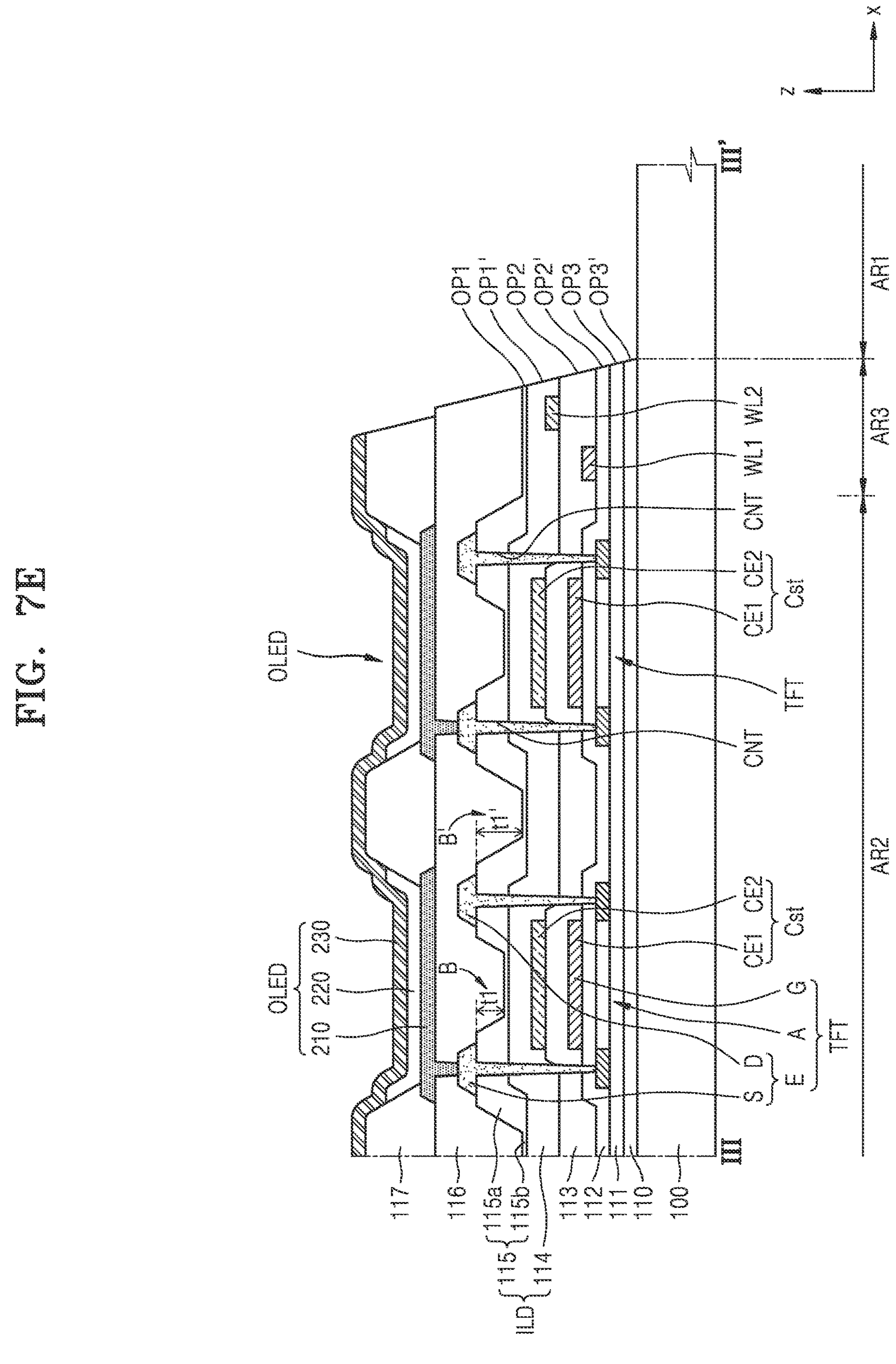

Referring to FIG. 7E, a planarization layer 116 and an organic light-emitting device OLED that is a display element on the planarization layer 116 may be formed on the interlayer insulating layer ILD.

The planarization layer 116 may have a single layer or multi-layer structure of an organic material or an inorganic material. The planarization layer 118 may general-purpose polymer, such as benzo cyclobutene (BCB), polyimide, hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, a p-xylene-based polymer, vinyl alcohol-based polymer, and a blend thereof. Also, the planarization layer 118 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 118 is formed, chemical mechanical polishing may be performed to provide a flat top surface.

According to some example embodiments of the present disclosure described above, a display apparatus in which transmittance is secured, and a method of manufacturing the same may be implemented. The scope of embodiments according to the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a display apparatus, the method comprising:

forming a semiconductor layer on a substrate;

forming a gate insulating layer so as to cover the semiconductor layer;

forming a gate electrode on the gate insulating layer, such that the gate electrode at least partially overlaps the semiconductor layer;

forming an interlayer insulating layer on the gate electrode;

forming a contact hole through the gate insulating layer and the interlayer insulating layer to expose a portion of the semiconductor layer;

forming an electrode layer on the interlayer insulating layer, the electrode layer being electrically connected to the semiconductor layer through the contact hole;

forming a photoresist pattern on the electrode layer corresponding to a first portion of the interlayer insulating layer;

etching the electrode layer using the photoresist pattern as a mask; and etching a second portion and a third portion of the interlayer insulating layer using the photoresist pattern, the second portion extending from the first portion of the interlayer insulating layer;

forming a planarization layer over the electrode layer;

forming a pixel electrode over the planarization layer and electrically connected to the electrode layer; and forming a pixel-definition layer on an edge of the pixel electrode and exposing a center of the pixel electrode, wherein the second portion of the interlayer insulating layer vertically overlaps a center of the pixel electrode, the third portion of the interlayer insulating layer extends from the first portion and overlaps the pixel-definition layer, and a first step is provided by a difference in thickness of the first portion and the second portion, and a second step, greater than the first step, is provided by a difference in thickness of the first portion and the third portion.

2. The method of claim 1, wherein the substrate comprises a first area, a second area surrounding the first area, and a third area between the first area and the second area, and the gate insulating layer and the interlayer insulating layer located on the first area are removed together when the contact hole is formed.

3. The method of claim 2, further comprising forming a buffer layer between the substrate and the semiconductor layer, wherein the buffer layer located on the first area is etched together when part of the interlayer insulating layer is etched.

4. The method of claim 1, further comprising cleaning the electrode layer concurrently with the etching of the second portion of the interlayer insulating layer.

5. The method of claim 1, further comprising etching the interlayer insulating layer using carbon tetrafluoride ($CF_4$).

6. The method of claim 5, further comprising applying a bias voltage with the etching of the interlayer insulating layer.

7. The method of claim 1, further comprising removing the photoresist pattern.

8. The method of claim 1, wherein a width of a top surface of the first portion is greater than a width of a bottom surface of the electrode layer.

* * * * *